(12) United States Patent
Mitsunaka

(10) Patent No.: US 12,738,932 B2
(45) Date of Patent: Sep. 15, 2026

(54) TEMPERATURE MEASURING CIRCUIT

(71) Applicant: Sharp Semiconductor Innovation Corporation, Tenri City (JP)

(72) Inventor: Takeshi Mitsunaka, Tenri City (JP)

(73) Assignee: Sharp Semiconductor Innovation Corporation, Tenri City (JP)

( * ) Notice: Subject to any disclaimer, the term of this patent is extended or adjusted under 35 U.S.C. 154(b) by 7 days.

(21) Appl. No.: 19/059,598

(22) Filed: Feb. 21, 2025

(65) Prior Publication Data

US 2025/0279776 A1 Sep. 4, 2025

(30) Foreign Application Priority Data

Feb. 29, 2024 (JP) ................................ 2024-029515

(51) Int. Cl.
*H03K 5/24* (2006.01)
*G01K 7/34* (2006.01)
*G05F 3/22* (2006.01)

(52) U.S. Cl.
CPC ............. *H03K 5/2418* (2013.01); *G01K 7/34* (2013.01); *G05F 3/225* (2013.01)

(58) Field of Classification Search
CPC ......... H03K 5/2418; G01K 7/34; G05F 3/225
USPC .......................................................... 327/512
See application file for complete search history.

(56) References Cited

U.S. PATENT DOCUMENTS 8,148,960 B2 * 4/2012 Tonomura ............... G05F 1/569 323/273
2018/0062630 A1 * 3/2018 Lim ......................... G01K 7/34
2018/0328792 A1 * 11/2018 Zhu .......................... G01K 7/34
2019/0353534 A1 * 11/2019 Mordakhay ............ G01K 7/226
2022/0163402 A1 * 5/2022 Kim ......................... G01K 7/01
2026/0029283 A1 * 1/2026 Zhou ........................ G01K 7/34

* cited by examiner

*Primary Examiner* — Tomi Skibinski
(74) *Attorney, Agent, or Firm* — ScienBiziP, P.C.

(57) ABSTRACT

A temperature measuring circuit includes: a first switch circuit configured to charge a capacitor upon receiving a first control signal and discharge the capacitor upon receiving a second control signal; a control circuit configured to set a control signal at a second control signal in response to an output voltage indicating that an inter-terminal voltage is higher than a first reference voltage, set the control signal at the first control signal in response to the output voltage indicating that the inter-terminal voltage is lower than a second reference voltage, and set the control signal at the second control signal in response to the output voltage indicating that the inter-terminal voltage is higher than a third reference voltage; a counter circuit configured to count a frequency of the control signal; and a temperature obtaining unit configured to obtain the temperature based on the frequency.

8 Claims, 22 Drawing Sheets

FIG. 1A

STATE 1

FIG. 1B

STATE 2

1
21a
21
51
I1
51a
21b
S1=High
51
51h
41b
41
42
43
45
Vin2
41c
42a
42b
51c
51g
51i
51d
51f
41a
Vout
S1=High
52
52c
52a
Vin1
44
51b
52b
51e
22a
11a
32b
31b
33b
I2
Vc
Vref/M
Vref
Vbe
22
32
31
33
22b
11b
11
32a
31a
33a
S1=High
S2=Low
S1=High
STATE 3

1
45
43
44
42b
S1=Low
42
42a
Vout
41c
41
41b
Vin2
41a
Vin1
51
51i
51f
51g
51h
51d
51e
S1=Low
52b
52c
33b
33
33a
Vbe
52
S2=High
STATE 4
52a
31b
Vref
31
31a
32b
Vref/M
32
32a
21
51a
S1=Low
21a
I1
21b
51c
51b
11a
Vc
11b
11
22a
I2
22
22b
S1=Low High
Low
Vref
Vref/M
S1
Vc
Vin2
Vin1
PERIOD
T1A
T1B STATE 1b
S1=High
S2=High
S3=High
Vout
Vin1
Vin2
Vref
Vbe
Vref/M
Vc
I1
I2

STATE 2b
S1=Low
S2=High
S3=High
Vout
Vin1
Vin2
Vref
Vref/M
Vbe
Vc
I1
I2

STATE 3a
S1=High
S2=Low
S3=Low
Vout
Vin1
Vin2
Vbe
Vref
Vref/M
Vc
I1
I2
m
p

FIG. 5F

STATE 4a 2
21a
21
51
I1
51a
21b
S1=High
51
51h
51g
41b
41
Vin2
m
51k
51i
41c
42a
42
42b
43
45
51c
51d
51j
41a
Vout
S1=High
52
52a
52c
51f
Vin1
p
44
51b
52b
51e
S3=High
22a
32b
31b
33b
I2
11a
Vref/M
Vref
Vbe
33
22
Vc
32
31
53
22b
11b
11
32a
31a
33a
S1=High
S2=Low
S1=High
S1=High
STATE 3b

FIG. 5H

STATE 4b

FIG. 8A

TEMPERATURE MEASURING CIRCUIT

CROSS-REFERENCE TO RELATED APPLICATION

The present application claims priority from Japanese Application JP 2024-029515, the content of which is hereby incorporated by reference into this application.

BACKGROUND OF THE INVENTION

1. Field of the Invention

The present disclosure relates to a temperature measuring circuit.

2. Description of the Related Art

United States Unexamined Patent Application Publication No. 2022/0163402 discloses a temperature sensor.

In the temperature sensor, a comparator outputs a first readout number when the voltage at a first input terminal is lower than the voltage at the second input terminal, and the comparator outputs a second readout number when the voltage at the second input terminal is lower than the voltage at the first input terminal. When the comparator outputs the first readout number, a read circuit is in an A-phase state. When the comparator outputs the second readout number, the read circuit is in a B-phase state.

When the readout circuit is in the A-phase state, a proportional current IPTAT is transmitted to a first end of a capacitor. Further, a second end of the capacitor is connected to a ground. Further, a voltage, which is the potential difference from the first to second ends of the capacitor, is input to the first input terminal of the comparator. Further, the voltage between the base and emitter of a bipolar junction transistor is input to the second input terminal of the comparator.

When the readout circuit is in the B-phase state, the proportional current IPTAT is transmitted to the second end of the capacitor. Further, the first end of the capacitor is connected to the ground. Further, ground voltage is input to the first input terminal of the comparator. Further, a voltage, which is the potential difference from the second to first ends of the capacitor, is input to the second input terminal of the comparator.

A controller determines a temperature based on the oscillation period of the readout number output by the comparator (paragraphs [0036], [0046], [0047], [0052], [0057], [0058], [0059], [0062], and [0063], as well as FIGS. 4 and 5).

SUMMARY OF THE INVENTION

In the temperature sensor disclosed in United States Unexamined Patent Application Publication No. 2022/0163402, the capacitor's second end receives a negative voltage when the readout circuit is in the B-phase state. This makes it difficult to form the temperature sensor onto a semiconductor substrate.

Further, in the temperature sensor, the proportional current IPTAT, which is transmitted to the capacitor's second end when the readout circuit is in the B-phase state, depends on the temperature property of a resistor provided in the circuit that generates the proportional current IPTAT. This makes it impossible to determine the temperature with high accuracy.

One aspect of the present disclosure has been made in view of this problem. The aspect of the present disclosure aims to provide a temperature measuring circuit that can be easily formed on a semiconductor substrate, and that can measure a temperature with high accuracy.

A temperature measuring circuit according to one aspect of the present disclosure is provided with the following: a capacitor configured to generate an inter-terminal voltage corresponding to the amount of stored electric charge; a first current supply configured to feed a first current; a second current supply configured to feed a second current; a first voltage supply configured to generate a first reference voltage; a second voltage supply configured to generate a second reference voltage; a third voltage supply configured to generate a third reference voltage corresponding to a temperature; and a comparator circuit configured to output an output voltage indicating the levels of two input voltages that are received. The temperature measuring circuit is also provided with a first switch circuit configured to, upon receiving a first control signal, charge the capacitor through the first current and set the two input voltages at a selected reference voltage and the inter-terminal voltage, and upon receiving a second control signal, discharge the capacitor through the second current and set the two input voltages at the second reference voltage and the inter-terminal voltage. The temperature measuring circuit is also provided with a second switch circuit configured to switch between a first connection state in which the selected reference voltage is set at the first reference voltage, and a second connection state in which the selected reference voltage is set at the third reference voltage. The temperature measuring circuit is also provided with a control circuit configured to, during a first period, set a control signal at the second control signal in response to the output voltage indicating that the inter-terminal voltage is higher than the first reference voltage while the control signal is set at the first control signal and the second switch circuit is in the first connection state, and set the control signal at the first control signal and bring the second switch circuit into the first connection state in response to the output voltage indicating that the inter-terminal voltage is lower than the second reference voltage while the control signal is set at the second control signal, and during a second period, set the control signal at the second control signal in response to the output voltage indicating that the inter-terminal voltage is higher than the third reference voltage while the control signal is set at the first control signal and the second switch circuit is in the second connection state, and set the control signal at the first control signal and bring the second switch circuit into the second connection state in response to the output voltage indicating that the inter-terminal voltage is lower than the second reference voltage while the control signal is set at the second control signal. The temperature measuring circuit is also provided with the following: a counter circuit configured to count a first frequency of the control signal during the first period, and a second frequency of the control signal during the second period; and a temperature obtaining unit configured to obtain the temperature based on the first and second frequencies.

BRIEF DESCRIPTION OF THE DRAWINGS

FIG. 1A is a circuit diagram illustrating a temperature measuring circuit in State 1 according to a first embodiment;

FIG. 1B is a circuit diagram illustrating the temperature measuring circuit in State 2 according to the first embodiment;

FIG. 5F is a circuit diagram illustrating the temperature measuring circuit in State 4*a* according to the second embodiment;

FIG. 5H is a circuit diagram illustrating the temperature measuring circuit in State 4*b* according to the second embodiment;

FIG. 8A is a timing chart showing the following time variations during the first period T1: time variations of the first input voltage Vin1 and the second input voltage Vin2, which are input to a comparator provided in the temperature measuring circuit according to the second embodiment; time variations of the inter-terminal voltage Vc, which is generated by a capacitor provided in the temperature measuring circuit; time variations of the control signal S1, which is output by a control circuit provided in the temperature measuring circuit; and time variations of a control signal S3, which is output by a switching control circuit provided in the temperature measuring circuit.

DETAILED DESCRIPTION OF THE INVENTION

The embodiments of the present disclosure will be described with reference to the drawings. It is noted that identical or equivalent constituents will be denoted by the same signs throughout the drawings, and the descriptions of redundancies will be omitted.

1 First Embodiment

1.1 Temperature Measuring Circuit

Figure 1A:
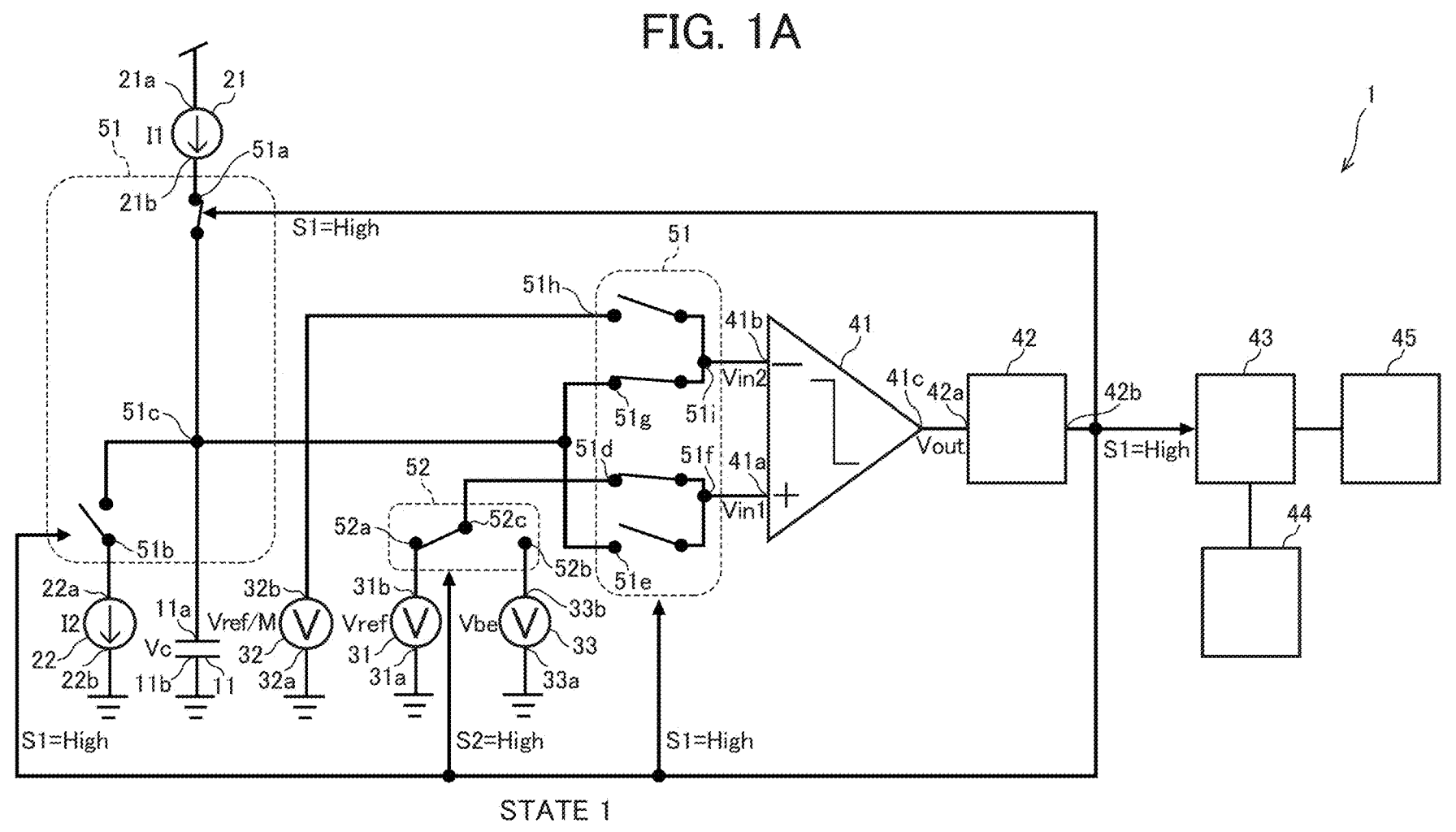
Figure 1B:
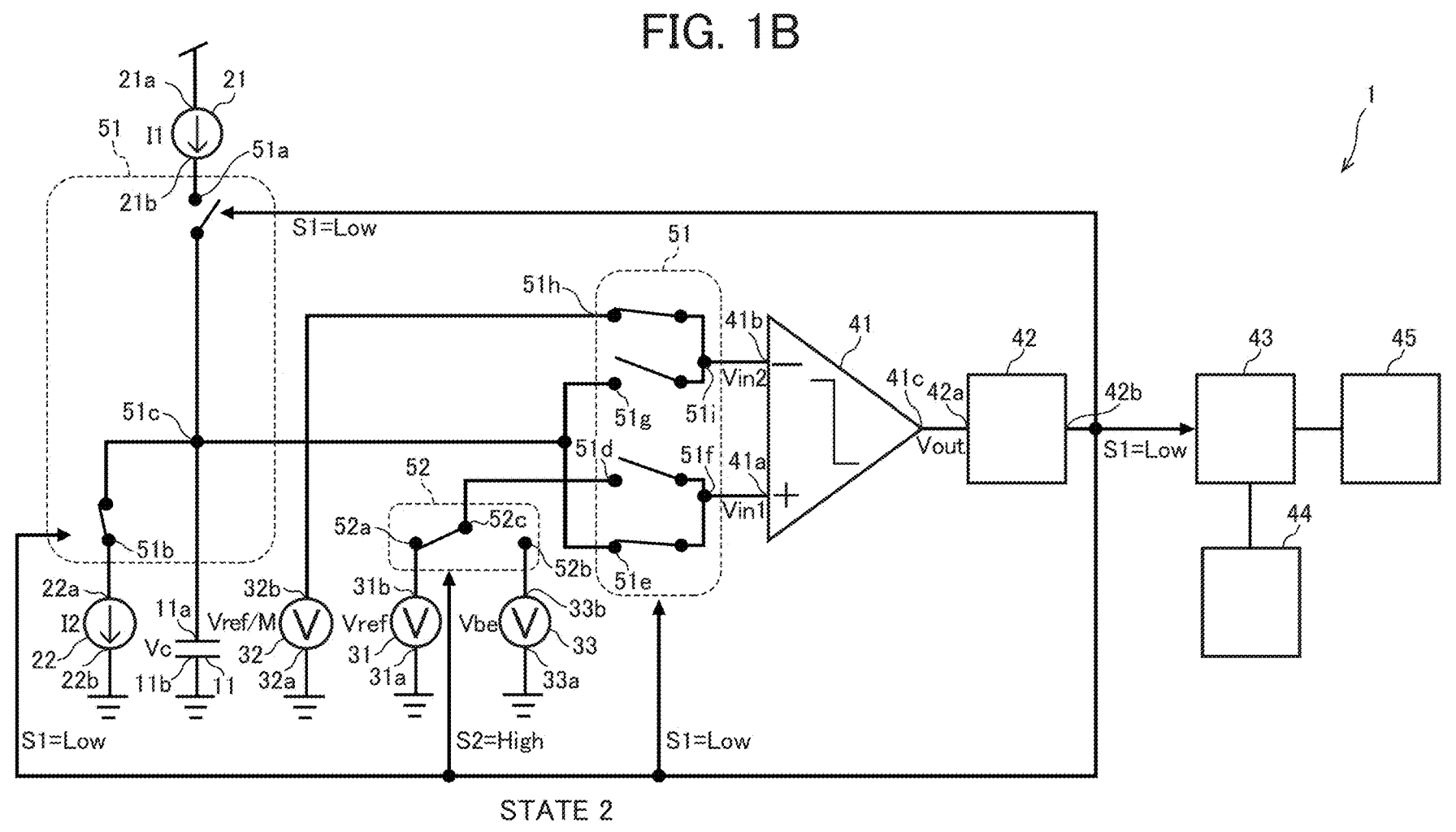
Figure 1C:
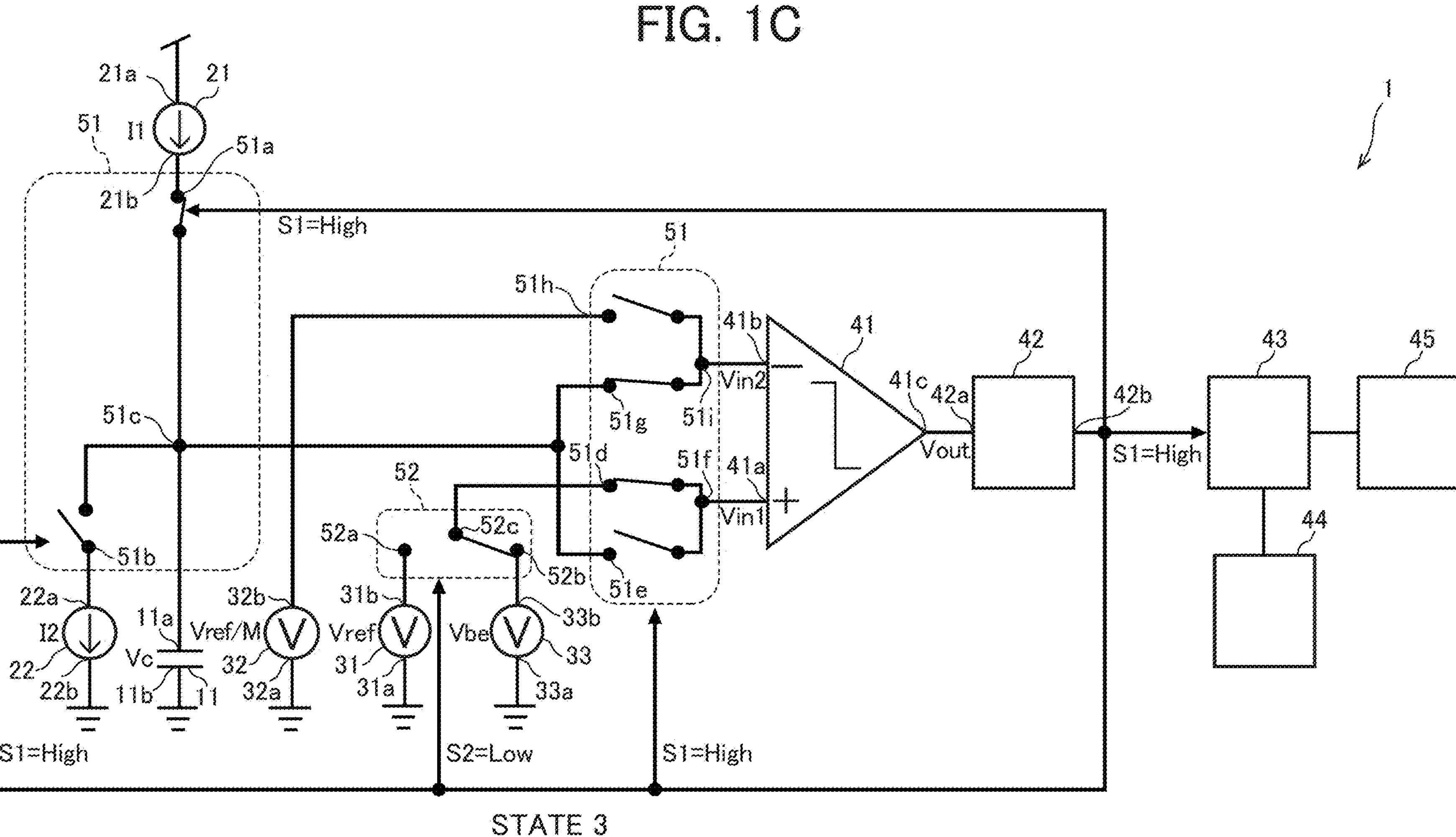
FIG. 1C is a circuit diagram illustrating the temperature measuring circuit in State 3 according to the first embodiment.
Figure 1D:
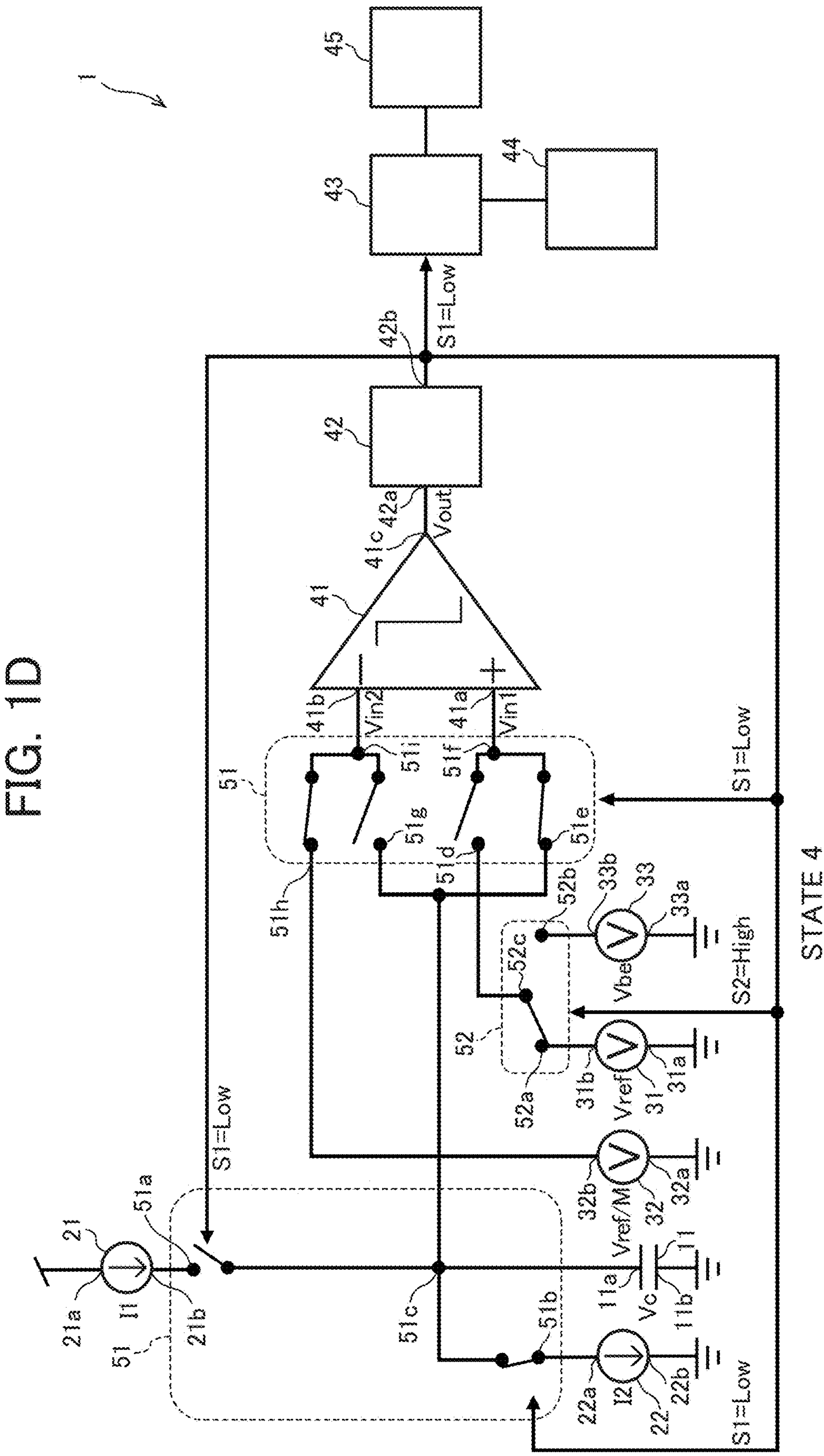
FIG. 1D is a circuit diagram illustrating the temperature measuring circuit in State 4 according to the first embodiment.

FIG. 1A is a circuit diagram illustrating a temperature measuring circuit in State 1 according to a first embodiment. FIG. 1B is a circuit diagram illustrating the temperature measuring circuit in State 2 according to the first embodiment. FIG. 1C is a circuit diagram illustrating the temperature measuring circuit in State 3 according to the first embodiment. FIG. 1D is a circuit diagram illustrating the temperature measuring circuit in State 4 according to the first embodiment.

The temperature measuring circuit, 1, according to the first embodiment illustrated in FIGS. 1A to 1D measures a temperature and outputs the measured temperature.

The temperature measuring circuit 1 is formed on a semiconductor substrate and is incorporated in a semiconductor integrated circuit. The semiconductor substrate is a complementary metal oxide semiconductor (CMOS) wafer for instance. The temperature measuring circuit 1 does not need to be formed on a semiconductor substrate and does not need to be incorporated in a semiconductor integrated circuit.

As illustrated in FIGS. 1A to 1D, the temperature measuring circuit 1 includes a capacitor 11, a first current supply 21, a second current supply 22, a first voltage supply 31, a second voltage supply 32, a third voltage supply 33, a comparator circuit 41, a control circuit 42, a counter circuit 43, a memory 44, a temperature obtaining unit 45, a first switch circuit 51, and a second switch circuit 52.

The capacitor 11 includes terminals 11*a* and 11*b*. The first current supply 21 includes a negative electrode 21*a* and a positive electrode 21*b*. The second current supply 22 includes a negative electrode 22*a* and a positive electrode 22*b*. The first voltage supply 31 includes a negative electrode 31*a* and a positive electrode 31*b*. The second voltage supply 32 includes a negative electrode 32*a* and a positive electrode 32*b*. The third voltage supply 33 includes a negative electrode 33*a* and a positive electrode 33*b*. The comparator circuit 41 includes a first input terminal 41*a*, a second input terminal 41*b*, and an output terminal 41*c*. The control circuit 42 includes an input terminal 42*a* and an output terminal 42*b*. The first switch circuit 51 includes terminals 51*a*, 51*b*, 51*c*, 51*d*, 51*e*, 51*f*, 51*g*, 51*h*, and 51*i*. The second switch circuit 52 includes terminals 52*a*, 52*b*, and 52*c*.

The terminal 11*b* of the capacitor 11 is grounded. The terminal 11*a* of the capacitor 11 is electrically connected to the terminal 51*c* of the first switch circuit 51.

The negative electrode 21*a* of the first current supply 21 is electrically connected to a power supply. The positive electrode 21*b* of the first current supply 21 is electrically connected to the terminal 51*a* of the first switch circuit 51. The negative electrode 22*a* of the second current supply 22 is electrically connected to the terminal 51*b* of the first switch circuit 51. The positive electrode 22*b* of the second current supply 22 is grounded. The negative electrode 31*a* of the first voltage supply 31 is grounded. The positive electrode 31*b* of the first voltage supply 31 is electrically connected to the terminal 52*a* of the second switch circuit 52. The negative electrode 32*a* of the second voltage supply 32 is grounded. The positive electrode 32*b* of the second voltage supply 32 is electrically connected to the terminal 51*h* of the first switch circuit 51. The negative electrode 33*a* of the third voltage supply 33 is grounded. The positive electrode 33*b* of the third voltage supply 33 is electrically connected to the terminal 52*b* of the second switch circuit 52. The first input terminal 41*a* and second input terminal 41*b* of the comparator circuit 41 are electrically connected to the terminals 51*f* and 51*i* of the first switch circuit 51, respectively. The output terminal 41*c* of the comparator circuit 41 is electrically connected to the input terminal 42*a* of the comparator circuit 42. The output terminal 42*b* of the control circuit 42 is electrically connected to the counter circuit 43, the first switch circuit 51, and the second switch circuit 52. The terminal 52*c* of the second switch circuit 52 is electrically connected to the terminal 51*d* of the first switch circuit 51. The counter circuit 43 is electrically connected to the control circuit 42. The memory 44 is electrically connected to the counter circuit 43. The temperature obtaining unit 45 is electrically connected to the counter circuit 43.

The capacitor 11 stores electric charge. The amount of stored electric charge increases by the amount of electric charge carried by a current flowing into the terminal 11*a* of the capacitor 11 and decreases by the amount of electric charge carried by a current flowing out of the terminal 11*a* of the capacitor 11. The capacitor 11 generates an inter-terminal voltage Vc corresponding to the amount of stored electric charge between the terminal 11*b* and the terminal 11*a*.

The first current supply 21 feeds a first current I1 flowing into the negative electrode 21*a* and flowing out of the positive electrode 21*b*.

The second current supply 22 feeds a second current I2 flowing into the negative electrode 22*a* and flowing out of the positive electrode 22*b*.

The first current supply 21 and the second current supply 22 are temperature-proportional current supplies, temperature-insensitive current supplies, process-variations-insensitive current supply, or other things. The first current supply 21 and the second current supply 22 that are process-variations-insensitive current supplies enable a temperature to be measured with high accuracy even when there are process variations in the semiconductor substrate on which the temperature measuring circuit 1 is formed.

The first voltage supply 31 generates a first reference voltage Vref between the negative electrode 31*a* and the positive electrode 31*b*.

The second voltage supply 32 generates a second reference voltage Vref/M between the negative electrode 32*a* and the positive electrode 32*b*.

The third voltage supply 33 generates a third reference voltage Vbe between the negative electrode 33*a* and the positive electrode 33*b*.

The first reference voltage Vref and the second reference voltage Vref/M are stable with respect to temperature. The third reference voltage Vbe is a voltage corresponding to temperature. The second reference voltage Vref/M is lower than the first reference voltage Vref and is 1/M times of the first reference voltage Vref. M is a positive value greater than 1.

The comparator circuit 41 outputs, from the output terminal 41*c*, an output voltage Vout indicating the levels of a first input voltage Vin1 input to the first input terminal 41*a*, and a second input voltage Vin2 input to the second input terminal 41*b*. The first input terminal 41*a* and second input terminal 41*b* of the comparator circuit 41 are a non-inverting input terminal and an inverting input terminal, respectively. The comparator circuit 41 thus outputs a first output voltage High as the output voltage Vout when the first input voltage Vin1 is higher than the second input voltage Vin2, and the comparator circuit 41 outputs a second output voltage Low as the output voltage Vout when the first input voltage Vin1 is lower than the second input voltage Vin2.

The control circuit 42 receives the output voltage Vout, which is output from the output terminal 41*c* of the comparator circuit 41, from the input terminal 42*a*. The control circuit 42 outputs the control signals S1 and S2 from the output terminal 42*b*. The control circuit 42 switches the outgoing control signal S1 between a first control signal High and a second control signal Low in synchronization with changes of the received output voltage Vout from the first output voltage High to the second output voltage Low. The control circuit 42 switches the outgoing control signal S2 between the first control signal High and the second control signal Low.

The counter circuit 43 receives the control signal S1 output from the output terminal 42*b* of the control circuit 42. The counter circuit 43 counts the frequency of the received control signal S1 and outputs the counted frequency.

The temperature obtaining unit 45 receives the frequency output from the counter circuit 43. The temperature obtaining unit 45 obtains a temperature from the received frequency.

The first switch circuit 51 receives the control signal S1 output from the output terminal 42*b* of the control circuit 42.

Upon receiving the control signal S1 being the first control signal High, the first switch circuit 51 brings its terminal 51*a* into electrical continuity with its terminal 51*c* and does not bring its terminal 51*b* into electrical continuity with its terminal 51*c*, as illustrated in FIG. 1A and FIG. 1C. The first switch circuit 51 thus causes the first current I1 flowing out of the positive electrode 21*b* of the first current supply 21 to flow into the terminal 11*a* of the capacitor 11, thus charging the capacitor 11 through the first current I1. This raises the inter-terminal voltage Vc, which is generated by the capacitor 11, along with time.

Upon receiving the control signal S1 being the second control signal Low, the first switch circuit 51 brings its terminal 51*b* into electrical continuity with its terminal 51*c* and does not bring its terminal 51*a* into electrical continuity with its terminal 51*c*, as illustrated in FIGS. 1B and 1D. The first switch circuit 51 thus causes the second current I2 flowing into the negative electrode 22*a* of the second current supply 22 to flow out of the terminal 11*a* of the capacitor 11, thus discharging the capacitor 11 through the second current I2. This lowers the inter-terminal voltage Vc, which is generated by the capacitor 11, along with time.

In addition, upon receiving the control signal S1 being the first control signal High, the first switch circuit 51 brings its terminal 51*d* into electrical continuity with its terminal 51*f* and does not bring its terminal 51*e* into electrical continuity with its terminal 51*f*, as illustrated in FIGS. 1A and 1C. The first switch circuit 51 thus sets the first input voltage Vin1 input to the first input terminal 41*a* of the comparator circuit 41, at the reference voltage Vref or Vbe selected by the second switch circuit 52.

Upon receiving the control signal S1 being the second control signal Low, the first switch circuit 51 brings its terminal 51*e* into electrical continuity with its terminal 51*f* and does not bring its terminal 51*d* into electrical continuity with its terminal 51*f*, as illustrated in FIGS. 1B and 1D. The first switch circuit 51 thus sets the first input voltage Vin1 at the inter-terminal voltage Vc generated by the capacitor 11.

In addition, upon receiving the control signal S1 being the first control signal High, the first switch circuit 51 brings its terminal 51*g* into electrical continuity with its terminal 51*i* and does not bring its terminal 51*h* into electrical continuity with its terminal 51*i*, as illustrated in FIGS. 1A and 1C. The first switch circuit 51 thus sets the second input voltage Vin2 at the inter-terminal voltage Vc generated by the capacitor 11.

Upon receiving the control signal S1 being the second control signal Low, the first switch circuit 51 brings its terminal 51*h* into electrical continuity with its terminal 51*i* and does not bring its terminal 51*g* into electrical continuity with its terminal 51*i*, as illustrated in FIGS. 1B and 1D. The first switch circuit 51 thus sets the second input voltage Vin2 at the second reference voltage Vref/M generated by the second voltage supply 32.

As described above, upon receiving the control signal S1 being the first control signal High, the first switch circuit 51 sets the two input voltages Vin1 and Vin2, which are compared by the comparator circuit 41, at the reference voltage Vref or Vbe, which is selected by the second switch circuit 52, and the inter-terminal voltage Vc, which is generated by the comparator circuit 11. Upon receiving the control signal S1 being the second control signal Low, the first switch circuit 51 sets the two input voltages Vin1 and Vin2, which are compared by the comparator circuit 41, at the inter-terminal voltage Vc, which is generated by the capacitor 11, and the second reference voltage Vref/M, which is generated by the second voltage supply 32.

The second switch circuit 52 receives the control signal S2 output from the output terminal 42*b* of the control circuit 42.

Upon receiving the control signal S2 being the first control signal High, the second switch circuit 52 brings its terminal 52*a* into electrical continuity with its terminal 52*c* and does not bring its terminal 52*b* into electrical continuity with its terminal 52*c*, as illustrated in FIG. 1A, FIG. 1B, and FIG. 1D. The second switch circuit 52 thus selects the first reference voltage Vref generated by the first voltage supply 31.

Upon receiving the control signal S2 being the second control signal Low, the second switch circuit 52 brings its terminal 52*b* into electrical continuity with its terminal 52*c* and does not bring its terminal 52*a* into electrical continuity with its terminal 52*c*, as illustrated in FIG. 1C. The second switch circuit 52 thus selects the third reference voltage Vref generated by the third voltage supply 33.

As described above, the second switch circuit 52 switches between a first connection state in which a reference voltage selected by the second switch circuit 52 is the first reference voltage Vref generated by the first voltage supply 31, and a second connection state in which the reference voltage selected by the second switch circuit 52 is the third reference voltage Vbe generated by the third voltage supply 33.

1.2 Operation of Temperature Measuring Circuit

Figure 2A:
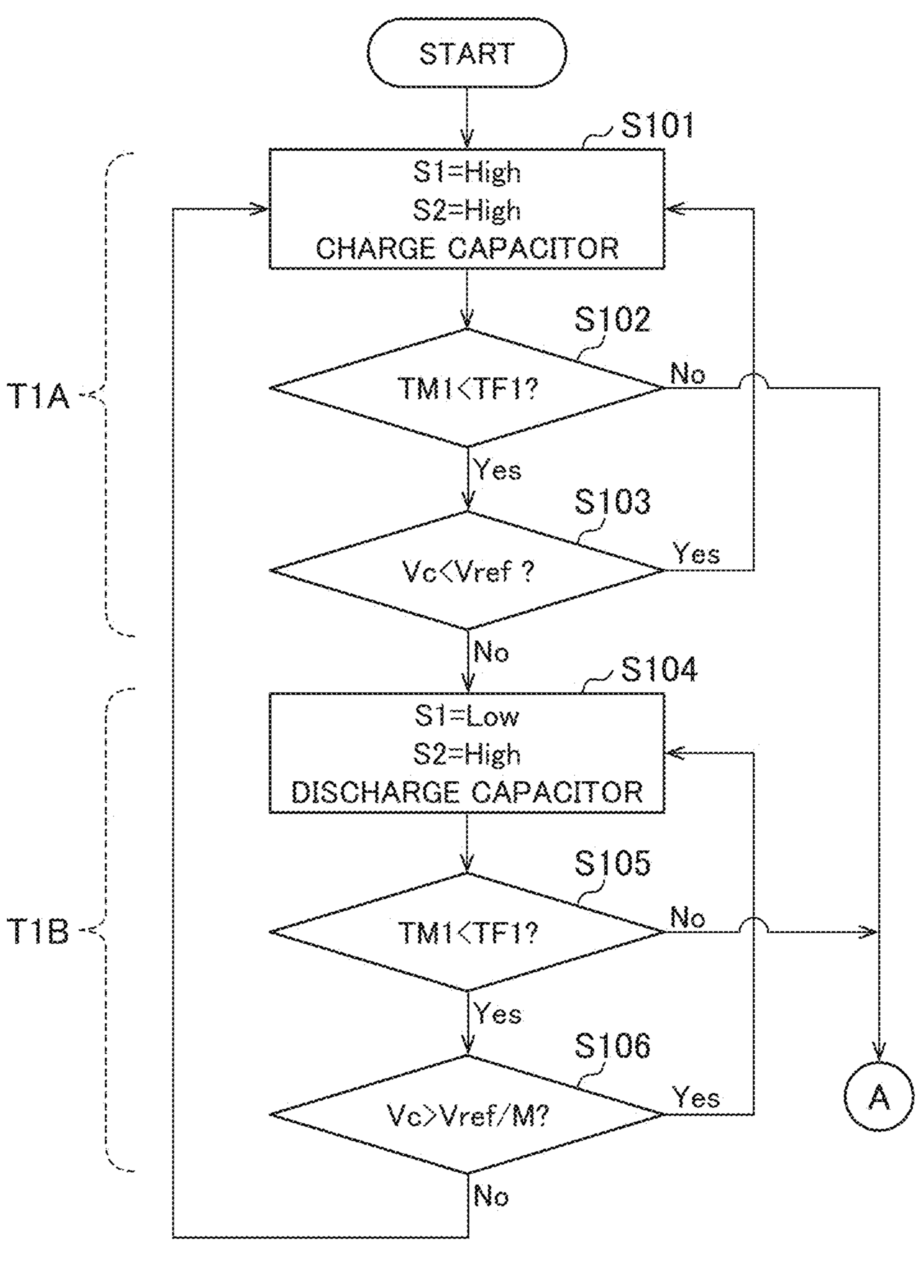
FIG. 2A is a flowchart showing the operation of the temperature measuring circuit according to the first embodiment.
Figure 2B:
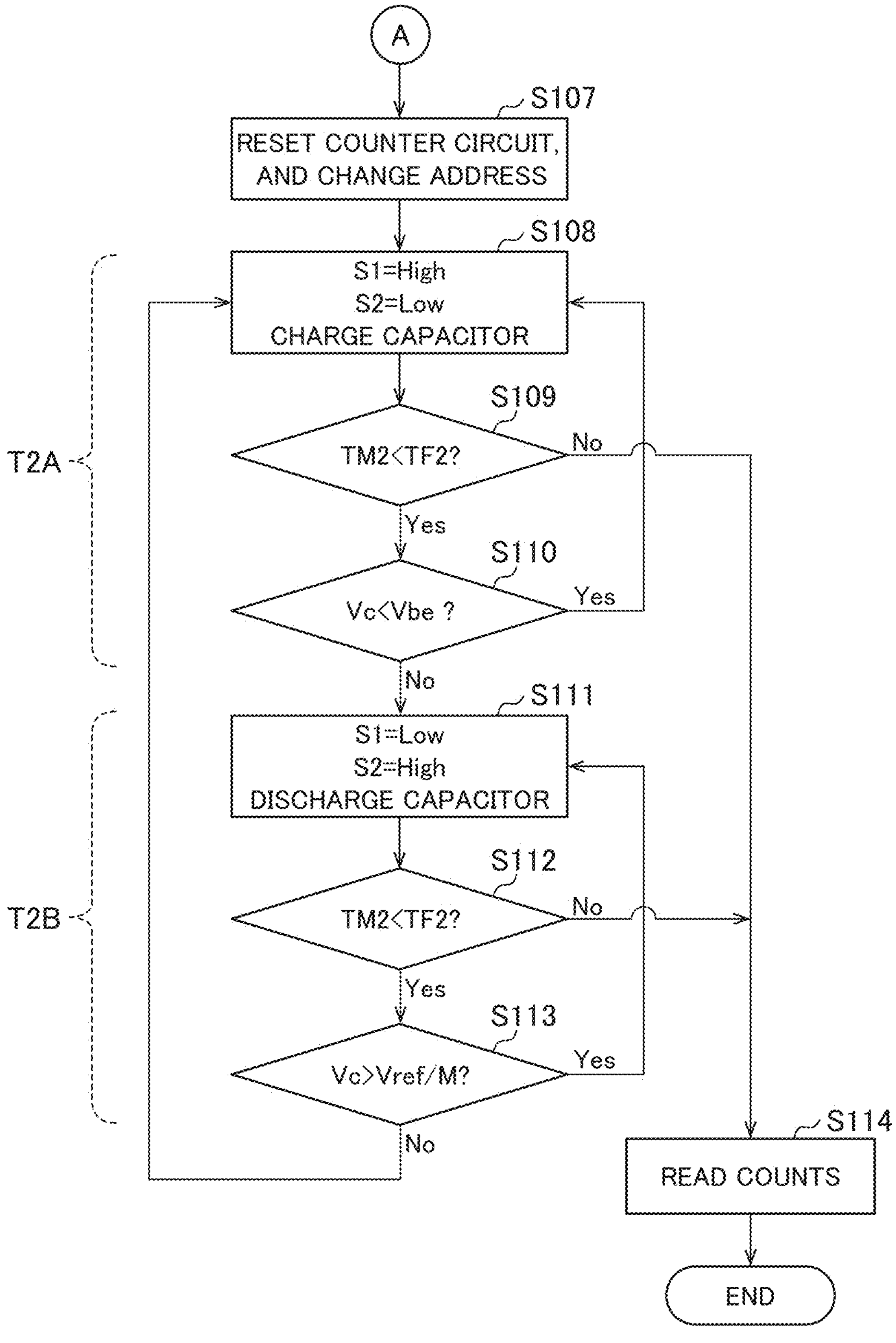
FIG. 2B is a flowchart showing the operation of the temperature measuring circuit according to the first embodiment.

FIGS. 2A and 2B are flowcharts showing the operation of the temperature measuring circuit according to the first embodiment.

The temperature measuring circuit 1 executes Steps S101 to S114 shown in FIGS. 2A and 2B.

The temperature measuring circuit 1 executes Steps S101 to S106 during a first period T1, which has a first measurement time TF1, to turn alternately into State 1 illustrated in FIG. 1A and State 2 illustrated in FIG. 1B. The temperature measuring circuit 1 executes Steps S108 to S113 during a subsequent second period T2, which has a second measurement time TF2, to turn alternately into State 3 illustrated in FIG. 1C and State 4 illustrated in FIG. 1D.

The temperature measuring circuit 1 executes Steps S101 to S103 during a period TIA, which is included in the first period T1, to turn into State 1 illustrated in FIG. 1A. The temperature measuring circuit 1 executes Steps S104 to S106 during a period T1B, which is included in the first period T1, to turn into State 2 illustrated in FIG. 1B.

The temperature measuring circuit 1 executes Steps S108 to S110 during a period T2A, which is included in the second period T2, to turn into State 3 illustrated in FIG. 1C. The temperature measuring circuit 1 executes Steps S111 to S113 during a period T2B, which is included in the second period T2, to turn into State 4 illustrated in FIG. 1D.

Charge During Period T1A

In Step S101, as illustrated in FIG. 1A, the control circuit 42 sets the control signal S1 at the first control signal High and sets the control signal S2 at the first control signal High.

Accordingly, the positive electrode 21*b* of the first current supply 21 is electrically connected to the terminal 11*a* of the capacitor 11. Further, the first input terminal 41*a* of the comparator circuit 41 is electrically connected to the positive electrode 31*b* of the first voltage supply 31. Further, the second input terminal 41*b* of the comparator circuit 41 is electrically connected to the terminal 11*a* of the capacitor 11.

Accordingly, the first current supply 21 charges the capacitor 11. Further, the comparator circuit 41 compares the first reference voltage Vref and the inter-terminal voltage Vc and sets the output voltage Vout at the first output voltage High.

In Step S102, the control circuit 42 determines whether a time TM1 elapsed from the start of the first period T1 is shorter than the first measurement time TF1. If determining that the time TM1 is shorter than the first measurement time TF1, the control circuit 42 executes Step S103. If determining that the time TM1 is equal to or longer than the first measurement time TF1, the control circuit 42 executes Step S107.

In Step S103, the control circuit 42 determines whether the inter-terminal voltage Vc is lower than the first reference voltage Vref on the basis of the output voltage Vout. If determining that the inter-terminal voltage Vc is lower than the first reference voltage Vref, the control circuit 42 executes Step S101. If determining that the inter-terminal voltage Vc is equal to or higher than the first reference voltage Vref, the control circuit 42 executes Step S104.

From Steps S101 to S103, the control circuit 42 causes the first current supply 21 to continue charging the capacitor 11 and causes the comparator circuit 41 to continue comparing the first reference voltage Vref and the inter-terminal voltage Vc until the time TM1 reaches the first measurement time TF1, or until the inter-terminal voltage Vc rises to the first reference voltage Vref. The control circuit 42 ends the first period T1 and starts the second period T2 in synchronization with that the time TM1 reaches the first measurement time TF1. The control circuit 42 ends the period T1A and starts the period T1B in synchronization with that the inter-terminal voltage Vc rises to the first reference voltage Vref, and that the output voltage Vout changes from the first output voltage High to the second output voltage Low.

Discharge During Period T1B

In Step S104, as illustrated in FIG. 1B, the control circuit 42 sets the control signal S1 at the second control signal Low and sets the control signal S2 at the first control signal High. The control circuit 42 may set the control signal S2 at the second control signal Low.

Accordingly, the negative electrode 22*a* of the second current supply 22 is electrically connected to the terminal 11*a* of the capacitor 11. Further, the first input terminal 41*a* of the comparator circuit 41 is electrically connected to the terminal 11*a* of the capacitor 11. Further, the second input terminal 41*b* of the comparator circuit 41 is electrically connected to the positive electrode 32*b* of the second voltage supply 32.

Accordingly, the second current supply 22 discharges the capacitor 11. Further, the comparator circuit 41 compares the inter-terminal voltage Vc and the second reference voltage Vref/M and sets the output voltage Vout at the first output voltage High.

In subsequent Step S105, the control circuit 42 determines whether the time TM1 is shorter than the first measurement time TF1. If determining that the time TM1 is shorter than the first measurement time TF1, the control circuit 42 executes Step S106. If determining that the time TM1 is equal to or longer than the first measurement time TF1, the control circuit 42 executes Step S107.

In Step S106, the control circuit 42 determines whether the inter-terminal voltage Vc is higher than the second reference voltage Vref/M on the basis of the output voltage Vout. If determining that the inter-terminal voltage Vc is higher than the second reference voltage Vref/M, the control circuit 42 executes Step S104. If determining that the inter-terminal voltage Vc is equal to or lower than the second reference voltage Vref/M, the control circuit 42 executes Step S101.

From Steps S104 to S106, the control circuit 42 causes the second current supply 22 to continue discharging the capacitor 11 and causes the comparator circuit 41 to continue comparing the inter-terminal voltage Vc and the second reference voltage Vref/M until the time TM1 reaches the first measurement time TF1, or until the inter-terminal voltage Vc lowers to the second reference voltage Vref/M. The control circuit 42 ends the first period T1 and starts the second period T2 in synchronization with that the time TM1 reaches the first measurement time TF1. The control circuit 42 ends the period T1B and starts the period T1A in synchronization with that the inter-terminal voltage Vc lowers to the second reference voltage Vref/M, and that the output voltage Vout changes from the first output voltage High to the second output voltage Low.

Counting During First Period T1

From Steps S101 to S106, the control circuit 42 sets the control signal S1 at the second control signal Low in response to the output voltage Vout indicating that the inter-terminal voltage Vc has risen to the first reference voltage Vref while the control signal S1 is the first reference voltage Vref, and while the second switch circuit 52 is in the first connection state. The control circuit 42 sets the control signal S1 at the first control signal High and brings the second switch circuit 52 into the first connection state in response to the output voltage Vout indicating that the inter-terminal voltage Vc has lowered to the second reference voltage Vref/M while the control signal S1 is the second control signal Low.

That the inter-terminal voltage Vc has risen to the first reference voltage Vref is indicated by a change of the output voltage Vout from the first output voltage High to the second output voltage Low. That the inter-terminal voltage Vc has lowered to the second output voltage Low is indicated by a change of the output voltage Vout from the first output voltage High to the second output voltage Low.

As such, the control signal S1 changes between the first control signal High and the second control signal Low periodically during the first period T1. The counter circuit 43 counts how many times the control signal S1 has changed between the first control signal High and the second control signal Low during the first period T1 (hereinafter, referred to as "counts"), and the counter circuit 43 writes the counts into a first address of the memory 44.

Reset of Counter Circuit and Change of Count Writing Destination

In Step S107, the counter circuit 43 is reset, and the destination into which the foregoing number of periodic changes counted by the counter circuit 43 is written is changed from the first address to a second address.

Charge During Period T2A

In Step S108, the control circuit 42 sets the control signal S1 at the first control signal High and sets the control signal S2 at the second control signal Low, as illustrated in FIG. 1C.

Accordingly, the positive electrode 21*b* of the first current supply 21 is electrically connected to the terminal 11*a* of the capacitor 11. Further, the first input terminal 41*a* of the comparator circuit 41 is electrically connected to the positive electrode 33*b* of the third voltage supply 33. Further, the second input terminal 41*b* of the comparator circuit 41 is electrically connected to the terminal 11*a* of the capacitor 11.

Accordingly, the first current supply 21 charges the capacitor 11. Further, the comparator circuit 41 compares the third reference voltage Vbe and the inter-terminal voltage Vc and sets the output voltage Vout at the first output voltage High.

In subsequent Step S109, the control circuit 42 determines whether a time TM2 elapsed from the start of the second period T2 is shorter than the second measurement time TF2. If determining that the time TM2 is shorter than the second measurement time TF2, the control circuit 42 executes Step S110. If determining that the time TM2 is equal to or longer than the second measurement time TF2, the control circuit 42 executes Step S114.

In Step S110, the control circuit 42 determines whether the inter-terminal voltage Vc is lower than the third reference voltage Vbe on the basis of the output voltage Vout. If determining that the inter-terminal voltage Vc is lower than the third reference voltage Vbe, the control circuit 42 executes Step S108. If determining that the inter-terminal voltage Vc is equal to or higher than the third reference voltage Vbe, the control circuit 42 executes Step S111.

From Steps S108 to S110, the control circuit 42 causes the first current supply 21 to continue charging the capacitor 11 and causes the comparator circuit 41 to continue comparing the third reference voltage Vbe and the inter-terminal voltage Vc until the time TM2 reaches the second measurement time TF2, or until the inter-terminal voltage Vc rises to the third reference voltage Vbe. The control circuit 42 ends the second period T2 in synchronization with that the time TM2 reaches the second measurement time TF2. The control circuit 42 ends the period T2A and starts the period T2B in synchronization with that the inter-terminal voltage Vc rises to the third reference voltage Vbe, and that the output voltage Vout changes from the first output voltage High to the second output voltage Low.

Discharge During Period T2B

In Step S111, as illustrated in FIG. 1D, the control circuit 42 sets the control signal S1 at the second control signal Low and sets the control signal S2 at the first control signal High. The control circuit 42 may set the control signal S2 at the second control signal Low.

Accordingly, the negative electrode 22*a* of the second current supply 22 is electrically connected to the terminal 11*a* of the capacitor 11. Further, the first input terminal 41*a* of the comparator circuit 41 is electrically connected to the terminal 11*a* of the capacitor 11. Further, the second input terminal 41*b* of the comparator circuit 41 is electrically connected to the positive electrode 32*b* of the second voltage supply 32.

Accordingly, the second current supply 22 discharges the capacitor 11. Further, the comparator circuit 41 compares the inter-terminal voltage Vc and the second reference voltage Vref/M and sets the output voltage Vout at the first output voltage High.

In subsequent Step S112, the control circuit 42 determines whether the time TM2 is shorter than the second measurement time TF2. If determining that the time TM2 is shorter than the second measurement time TF2, the control circuit 42 executes Step S113. If determining that the time TM2 is equal to or longer than the second measurement time TF2, the control circuit 42 executes Step S114.

In Step S113, the control circuit 42 determines whether the inter-terminal voltage Vc is higher than the second reference voltage Vref/M on the basis of the output voltage Vout. If determining that the inter-terminal voltage Vc is higher than the second reference voltage Vref/M, the control circuit 42 executes Step S111. If determining that the inter-terminal voltage Vc is equal to or lower than the second reference voltage Vref/M, the control circuit 42 executes Step S108.

From Steps S111 to S113, the control circuit 42 causes the second current supply 22 to continue discharging the capacitor 11 and causes the comparator circuit 41 to continue comparing the inter-terminal voltage Vc and the second reference voltage Vref/M until the time TM2 reaches the second measurement time TF2, or until the inter-terminal voltage Vc lowers to the second reference voltage Vref/M. The control circuit 42 ends the second period T2 in synchronization with that the time TM2 reaches the second measurement time TF2. The control circuit 42 ends the period T2B and starts the period T2A in synchronization with that the inter-terminal voltage Vc lowers to the second reference voltage Vref/M, and that the output voltage Vout changes from the first output voltage High to the second output voltage Low.

Counting During Second Period T2

From Steps S107 to S113, the control circuit 42 sets the control signal S1 at the second control signal Low in response to the output voltage Vout indicating that the inter-terminal voltage Vc has risen to the third reference voltage Vbe while the control signal S1 is the first control signal High, and while the second switch circuit 52 is in the first connection state. The control circuit 42 sets the control signal S1 at the first control signal High and brings the second switch circuit 52 into the first connection state in response to the output voltage Vout indicating that the inter-terminal voltage Vc has lowered to the second reference voltage Vref/M while the control signal S1 is the second control signal Low.

That the inter-terminal voltage Vc has risen to the third reference voltage Vbe is indicated by a change of the output voltage Vout from the first output voltage High to the second output voltage Low. That the inter-terminal voltage Vc has lowered to the second reference voltage Vref/M is indicated by a change of the output voltage Vout from the first output voltage High to the second output voltage Low.

As such, the control signal S1 changes between the first control signal High and the second control signal Low periodically during the second period T2. The counter circuit 43 counts how many times the control signal S1 has changed between the first control signal High and the second control signal Low during the second period T2, and the counter circuit 43 writes the counts into the second address of the memory 44.

Counts Readout

In Step S114, the counter circuit 43 reads the counts from the first and second addresses, and from the counts read from the first and second addresses, the counter circuit 43 obtains a first frequency F1 of the control signal S1 during the first period T1, and a second frequency F2 of the control signal S1 during the second period T2. Further, the temperature obtaining unit 45 obtains the temperature on the basis of the first frequency F1 and second frequency F2.

1.3 Time Variations of First Input Voltage, Second Input Voltage, Inter-Terminal Voltage, and Control Signal Time Variations During First Period T1

Figure 3A:
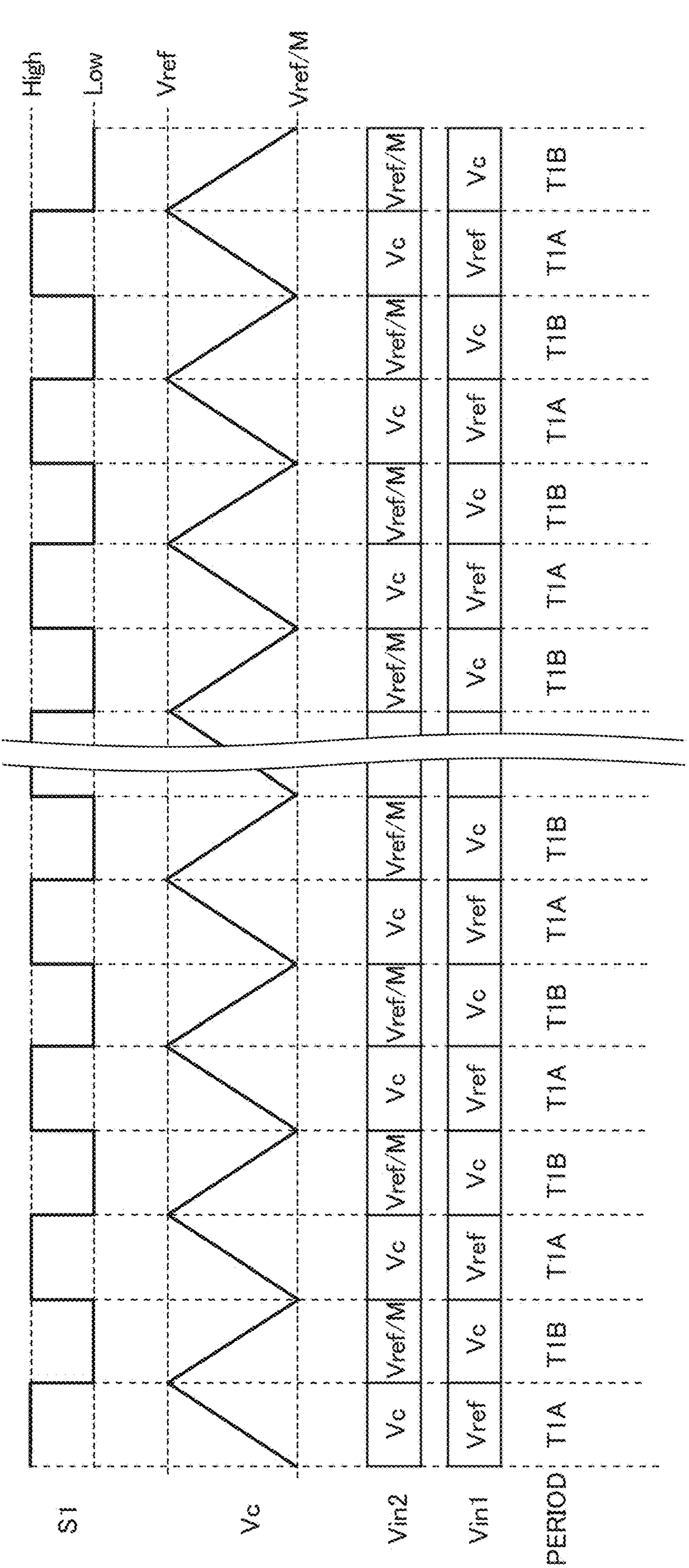
FIG. 3A is a timing chart showing the following time variations during a first period T1: time variations of a first input voltage Vin1 and a second input voltage Vin2, which are input to a comparator provided in the temperature measuring circuit according to the first embodiment; time variations of an inter-terminal voltage Vc, which is generated by a capacitor provided in the temperature measuring circuit; and time variations of a control signal S1, which is output by a control circuit provided in the temperature measuring circuit.

FIG. 3A is a timing chart showing the following time variations during the first period T1: time variations of the first input voltage Vin1 and second input voltage Vin2, which are input to the comparator provided in the temperature measuring circuit according to the first embodiment; time variations of the inter-terminal voltage Vc, which is generated by the capacitor provided in the temperature measuring circuit; and time variations of the control signal S1, which is output by the control circuit provided in the temperature measuring circuit.

As shown in FIG. 3A, in the temperature measuring circuit 1 in Steps S101 to S106, the periods T1A and T1B come alternately during the first period T1.

During the period T1A, the first input voltage Vin1 and the second input voltage Vin2 are at the first reference voltage Vref and the inter-terminal voltage Vc, respectively. In addition, the inter-terminal voltage Vc rises along with time. Accordingly, the inter-terminal voltage Vc rises from the second reference voltage Vref/M to the first reference voltage Vref. In addition, the control signal S1 is kept at the first control signal High.

During the period T1B, the first input voltage Vin1 and the second input voltage Vin2 are at the inter-terminal voltage Vc and the second reference voltage Vref/M, respectively. In addition, the inter-terminal voltage Vc lowers along with time. Accordingly, the inter-terminal voltage Vc lowers from the first reference voltage Vref to the second reference voltage Vref/M. In addition, the control signal S1 is kept at the second control signal Low.

During the periods T1A and T1B, the input terminal to which the inter-terminal voltage Vc is input is switched between the first input terminal 41*a* and second input terminal 41*b* of the comparator circuit 41. This enables switching between a state in which the fact that the inter-terminal voltage Vc has risen to a reference voltage can be detected, and a state in which the fact that the inter-terminal voltage Vc has lowered to the reference voltage can be detected. Also, during the periods T1A and T1B, the reference voltage compared to the inter-terminal voltage Vc is switched between the first reference voltage Vref and the second reference voltage Vref/M. This enables switching between a state in which the fact that the inter-terminal voltage Vc has risen to the first reference voltage Vref can be detected, and a state in which the fact that the inter-terminal voltage Vc has lowered to the second reference voltage Vref/M can be detected.

The time necessary for the inter-terminal voltage Vc to rise from the second reference voltage Vref/M to the first reference voltage Vref does not depend on temperature. The time necessary for the inter-terminal voltage Vc to lower from the first reference voltage Vref to the second reference voltage Vref/M does not depend on temperature. Hence, the first frequency F1 is independent of temperature and can be used as a reference frequency.

Time Variations During Second Period T2

Figure 3B:
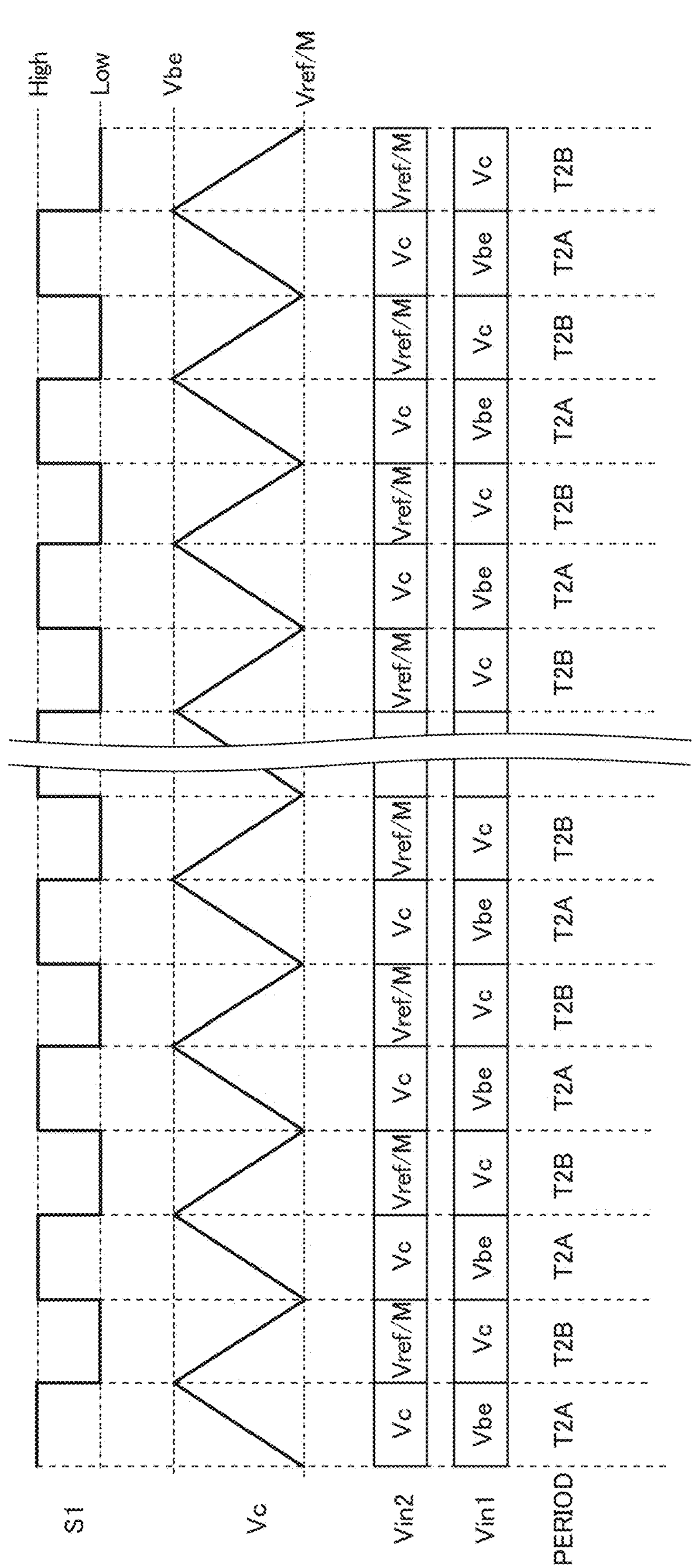
FIG. 3B is a timing chart showing the following time variations during a second period T2: time variations of the first input voltage Vin1 and the second input voltage Vin2, which are input to the comparator provided in the temperature measuring circuit according to the first embodiment; time variations of the inter-terminal voltage Vc, which is generated by the capacitor provided in the temperature measuring circuit; and time variations of the control signal S1, which is output by the control circuit provided in the temperature measuring circuit.

FIG. 3B is a timing chart showing the following time variations during the second period T2: time variations of the first input voltage Vin1 and second input voltage Vin2, which are input to the comparator provided in the temperature measuring circuit according to the first embodiment; time variations of the inter-terminal voltage Vc, which is generated by the capacitor provided in the temperature measuring circuit; and time variations of the control signal S1, which is output by the control circuit provided in the temperature measuring circuit.

As shown in FIG. 3B, in the temperature measuring circuit 1 in Steps S108 to S113, the periods T2A and T2B come alternately during the second period T2.

During the period T2A, the first input voltage Vin1 and the second input voltage Vin2 are at the third reference voltage Vbe and the inter-terminal voltage Vc, respectively. In addition, the inter-terminal voltage Vc rises along with time. Accordingly, the inter-terminal voltage Vc rises from the second reference voltage Vref/M to the third reference voltage Vbe. In addition, the control signal S1 is kept at the first control signal High.

During the period T2B, the first input voltage Vin1 and the second input voltage Vin2 are at the inter-terminal voltage Vc and the second reference voltage Vref/M, respectively. In addition, the inter-terminal voltage Vc lowers along with time. Accordingly, the inter-terminal voltage Vc lowers from the third reference voltage Vbe to the second reference voltage Vref/M. In addition, the control signal S1 is kept at the second control signal Low.

During the periods T2A and T2B, the input terminal to which the inter-terminal voltage Vc is input is switched between the first input terminal 41*a* and second input terminal 41*b* of the comparator circuit 41. This enables switching between a state in which the fact that the inter-terminal voltage Vc has risen to a reference voltage can be detected, and a state in which the fact that the inter-terminal voltage Vc has lowered to the reference voltage can be detected. Also, during the periods T2A and T2B, the reference voltage compared to the inter-terminal voltage Vc is switched between the third reference voltage Vbe and the second reference voltage Vref/M. This enables switching between a state in which the fact that the inter-terminal voltage Vc has risen to the third reference voltage Vbe can be detected, and a state in which the fact that the inter-terminal voltage Vc has lowered to the second reference voltage Vref/M can be detected.

The time necessary for the inter-terminal voltage Vc to rise from the second reference voltage Vref/M to the third reference voltage Vbe depends on temperature. The time necessary for the inter-terminal voltage Vc to lower from the third reference voltage Vbe to the second reference voltage Vref/M depends on temperature. Hence, the second frequency F2 is dependent on temperature, and unlike the first frequency F1, the second frequency F2 can be used for specifying a temperature.

1.4 First Reference Voltage, Second Reference Voltage, and Third Reference Voltage The first voltage supply 31 includes a bandgap reference circuit. The bandgap reference circuit generates temperature-independent voltage. The first voltage supply 31 extracts the generated voltage from the bandgap reference circuit and uses the extracted voltage as the first reference voltage Vref.

The second voltage supply 32 includes a bandgap reference circuit and a resistive voltage-dividing circuit. The bandgap reference circuit generates temperature-independent voltage. The resistive voltage-dividing circuit divides the generated voltage. The second voltage supply 32 extracts the divided voltage from the resistive voltage-dividing circuit and uses the extracted voltage as the second reference voltage Vref/M.

Figure 4:
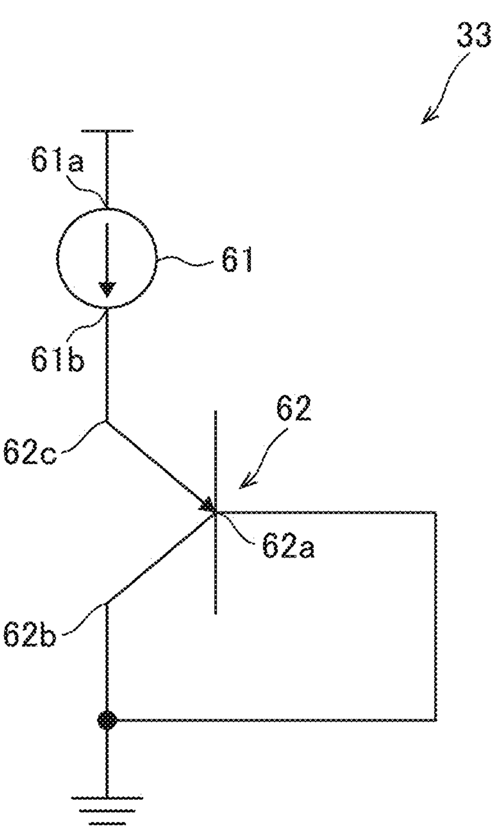
FIG. 4 is a circuit diagram of a third voltage supply provided in the temperature measuring circuit according to the first embodiment.

FIG. 4 is a circuit diagram of the third voltage supply provided in the temperature measuring circuit according to the first embodiment.

As illustrated in FIG. 4, the third voltage supply 33 includes a current supply 61 and a bipolar transistor 62. The current supply 61 has a negative electrode 61*a* and a positive electrode 61*b*. The bipolar transistor 62 has a base 62*a*, a collector 62*b*, and an emitter 62*c*.

The negative electrode 61*a* of the current supply 61 is electrically connected to a power supply. The positive electrode 61*b* of the current supply 61 is electrically connected to the emitter 62*c* of the bipolar transistor 62. The bipolar transistor 62 is in diode connection. Thus, the base 62*a* and collector 62*b* of the bipolar transistor 62 are electrically connected to each other. The base 62*a* and the collector 62*b* are grounded.

The current supply 61 feeds a current flowing into the negative electrode 61*a* and flowing out of the positive electrode 61*b*. The current to be fed may or may not be temperature-proportional current. However, a semiconductor integrated circuit that incorporates the temperature measuring circuit 1 includes, in most cases, a current supply that feeds a temperature-proportional current. Hence, when the current to be fed is temperature-proportional current, the semiconductor integrated circuit can be downsized.

The bipolar transistor 62 feeds a current flowing into the emitter 62*c* and flowing out of the collector 62*b*.

The third voltage supply 33 extracts a voltage generated between the base 62*a* and emitter 62*c* from the emitter 62*c* and uses the extracted voltage as the third reference voltage Vbe.

The temperature coefficient of the voltage generated between the base 62*a* and emitter 62*c* is significantly smaller than the temperature coefficient of temperature-proportional current. Hence, even when the current to be fed is temperature-proportional current, the voltage extracted from the emitter 62*c* has a temperature coefficient close to the former temperature coefficient.

1.5 Temperature Obtainment

A ratio (Vbe−Vref/M):(Vref−Vref/M) coincides with the ratio between the first frequency F1 and second frequency F2, i.e., F1:F2, where (Vbe-Vref/M) denotes the difference between the third reference voltage Vbe and second reference voltage Vref/M, and where (Vref-Vref/M) denotes the difference between the first reference voltage Vref and second reference voltage Vref/M. Accordingly, the temperature obtaining unit 45 determines the third reference voltage Vbe from the first reference voltage Vref, the second reference voltage Vref/M, the first frequency F1, and the second frequency F2 in accordance with Mathematical Expression (11).

[Numeral 1]

$$Vbe = \frac{F1}{F2} \times \left(Vref - \frac{Vref}{M}\right) + \frac{Vref}{M} \tag{11}$$

The temperature obtaining unit 45 also obtains a temperature Temp from the temperature property of the determined third reference voltage Vbe. For example, the temperature obtaining unit 45 obtains the temperature Temp in accordance with Mathematical Expression (12) using a Boltzmann constant K, a saturation current Is, and a collector current Ic.

[Numeral 2]

$$Temp = \frac{Vbe}{K} \cdot \log\left[\frac{I_S + I_C}{I_S}\right] \tag{12}$$

1.6 Advantages of Temperature Measuring Circuit

In the temperature measuring circuit 1, the inter-terminal voltage Vc is kept at the second reference voltage Vref/M, which is a positive voltage, or higher. Thus, the voltage at the terminal 11*a* of the capacitor 11 is not a positive voltage. This facilitates forming the temperature measuring circuit 1 onto the semiconductor substrate.

In the temperature measuring circuit 1, the first current supply 21 and the second current supply 22 do not have to be temperature-proportional current supplies. This enables various current supplies to be used as the first current supply 21 and the second current supply 22. This also enables the temperature measuring circuit 1 to measure the temperature with high accuracy without being affected by variations in temperature-proportional current.

2 Second Embodiment

The following describes points in which the second embodiment is different from the first embodiment. With regard to what will not be described, a configuration similar to the configuration applied to the first embodiment will be applied to the second embodiment as well.

2.1 Temperature Measuring Circuit

Figure 5A:
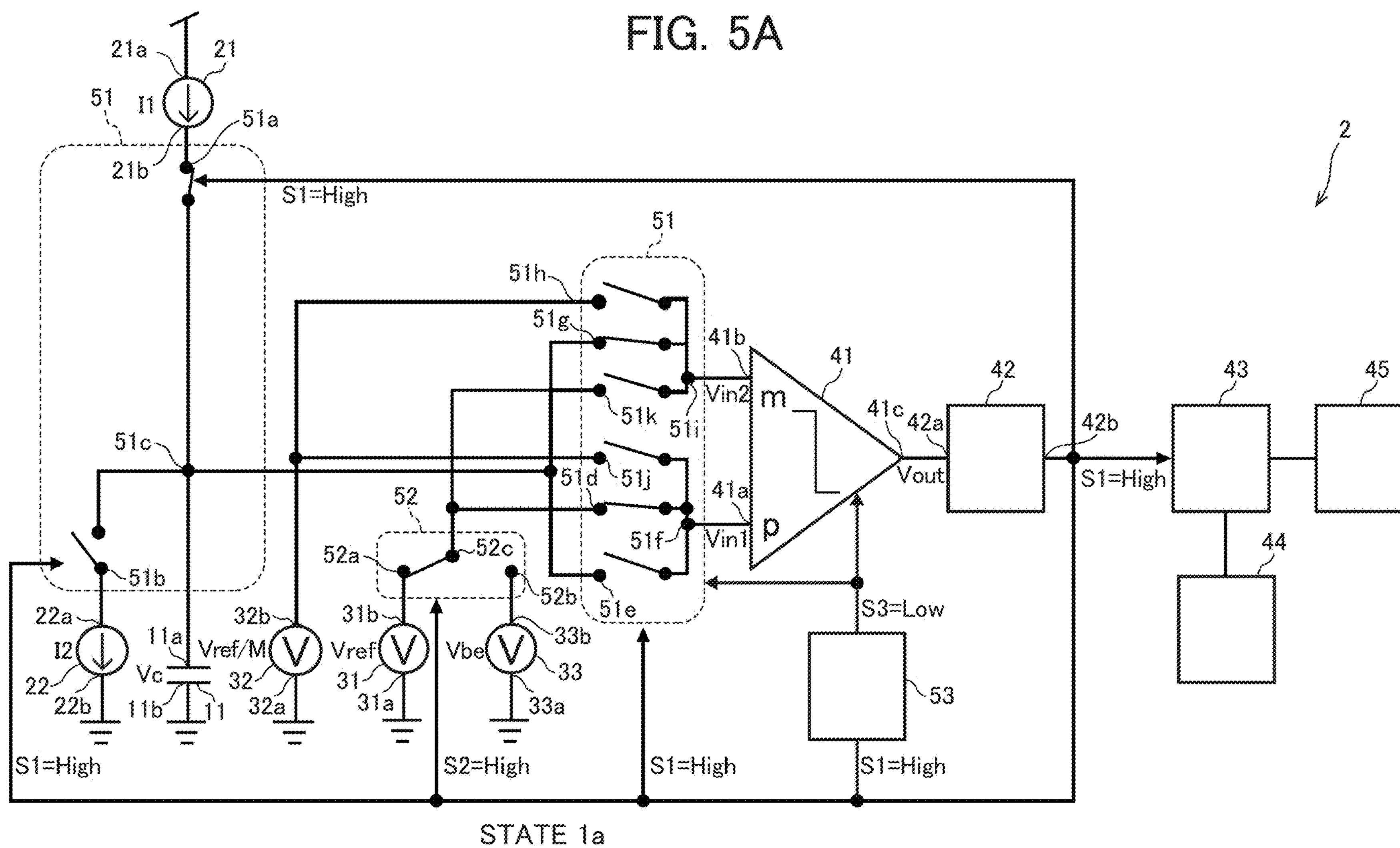
FIG. 5A is a circuit diagram illustrating a temperature measuring circuit in State 1*a* according to a second embodiment.
Figure 5B:
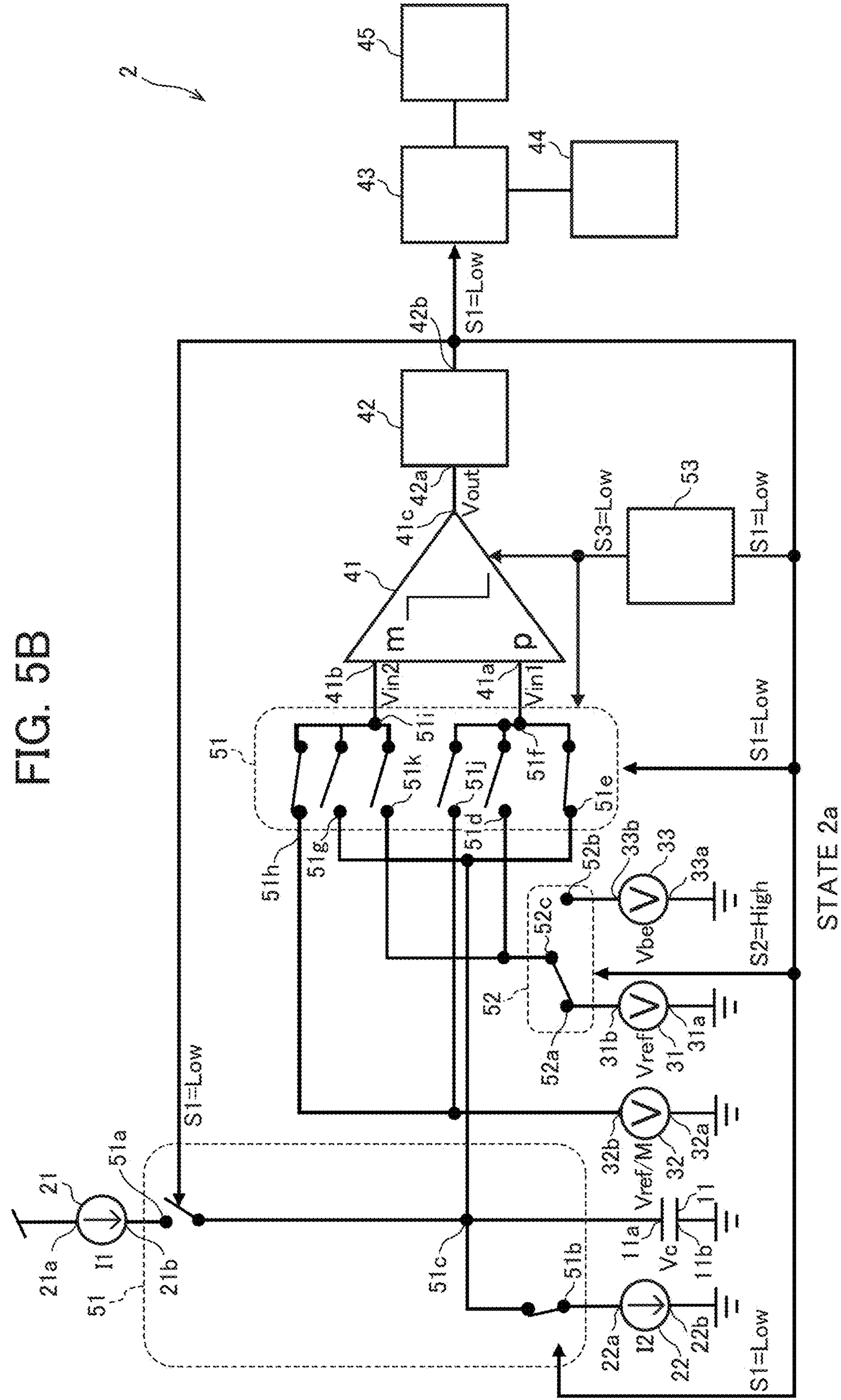
FIG. 5B is a circuit diagram illustrating the temperature measuring circuit in State 2*a* according to the second embodiment.
Figure 5C:
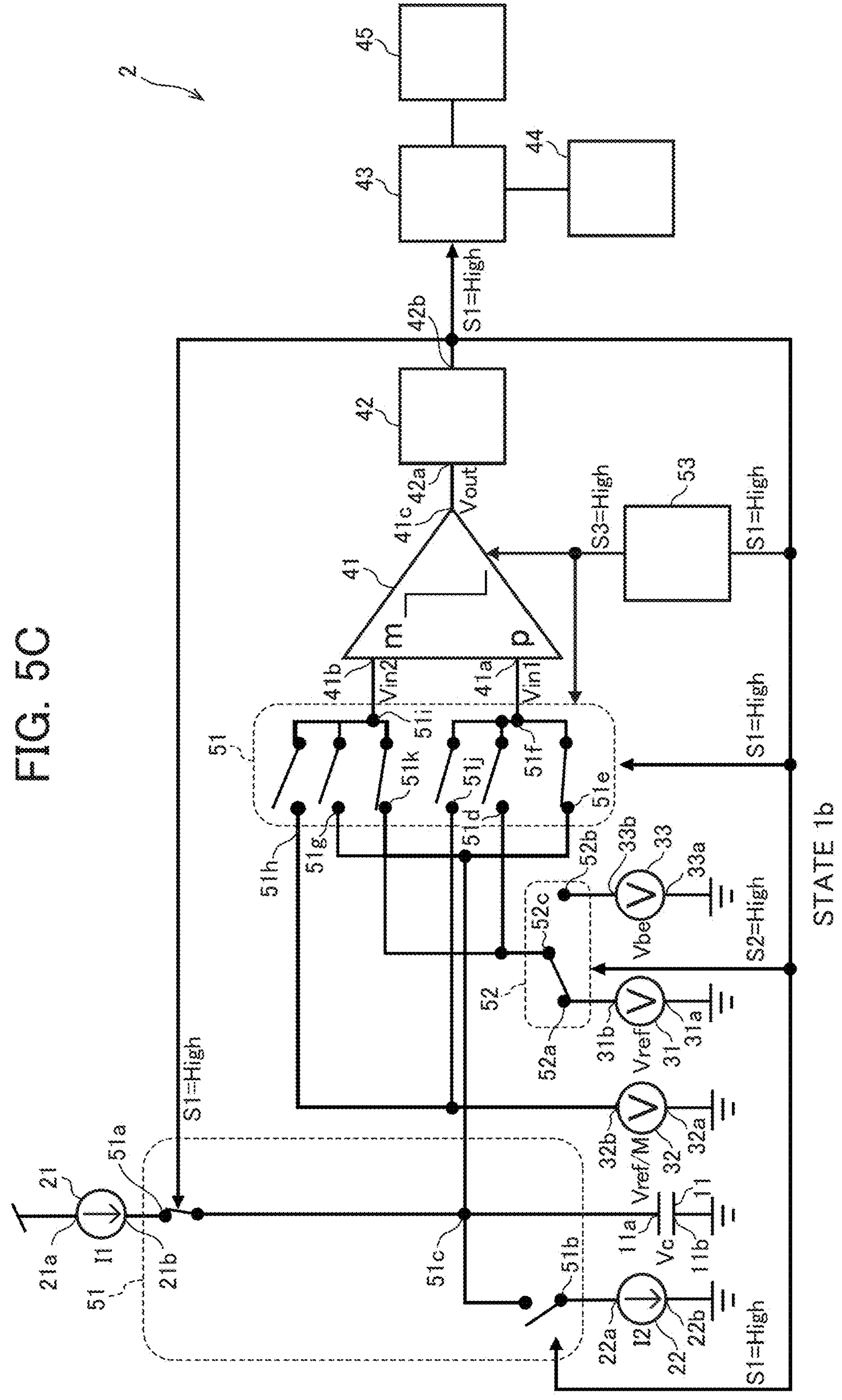
FIG. 5C is a circuit diagram illustrating the temperature measuring circuit in State 1*b* according to the second embodiment.
Figure 5D:
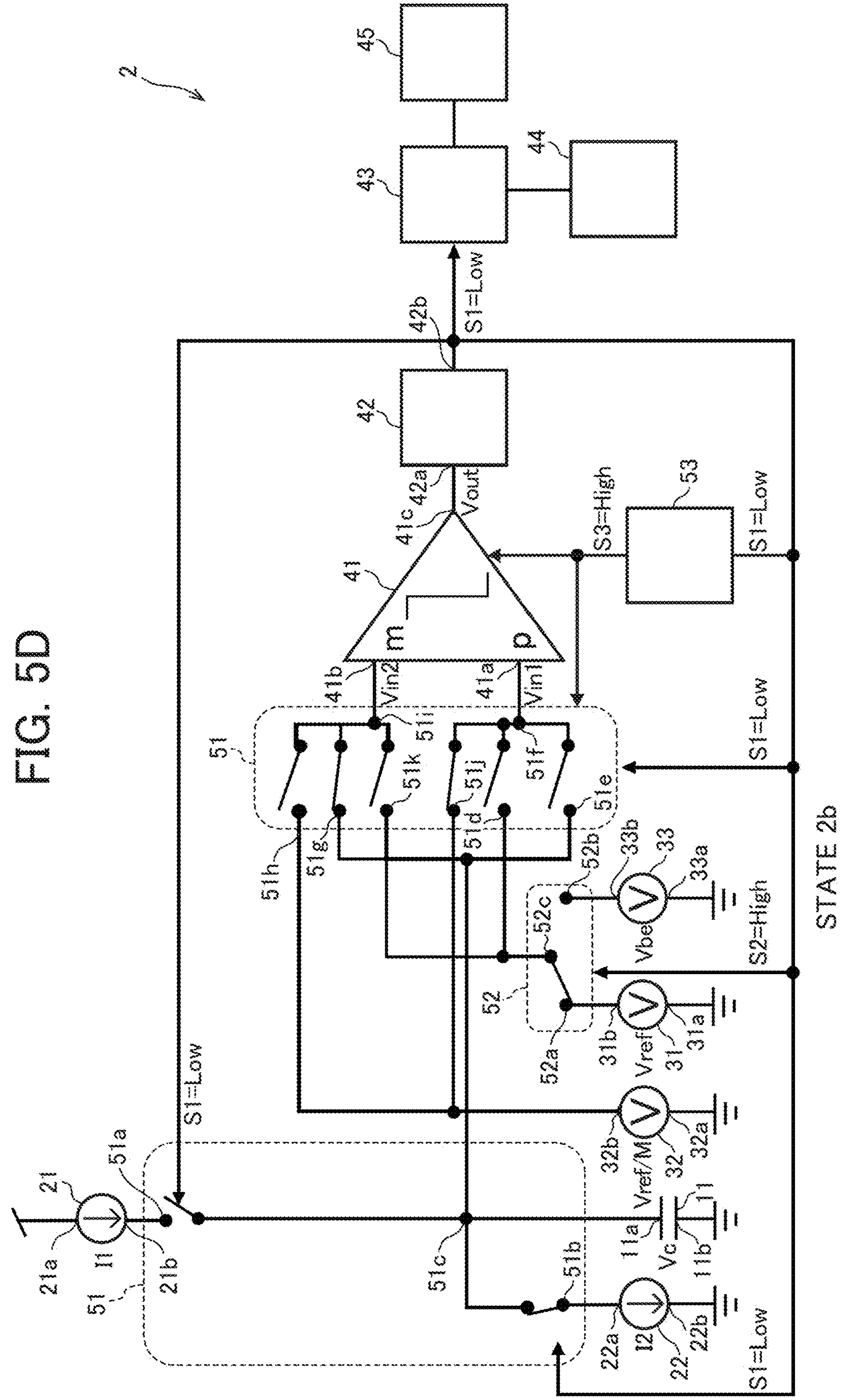
FIG. 5D is a circuit diagram illustrating the temperature measuring circuit in State 2*b* according to the second embodiment.
Figure 5E:
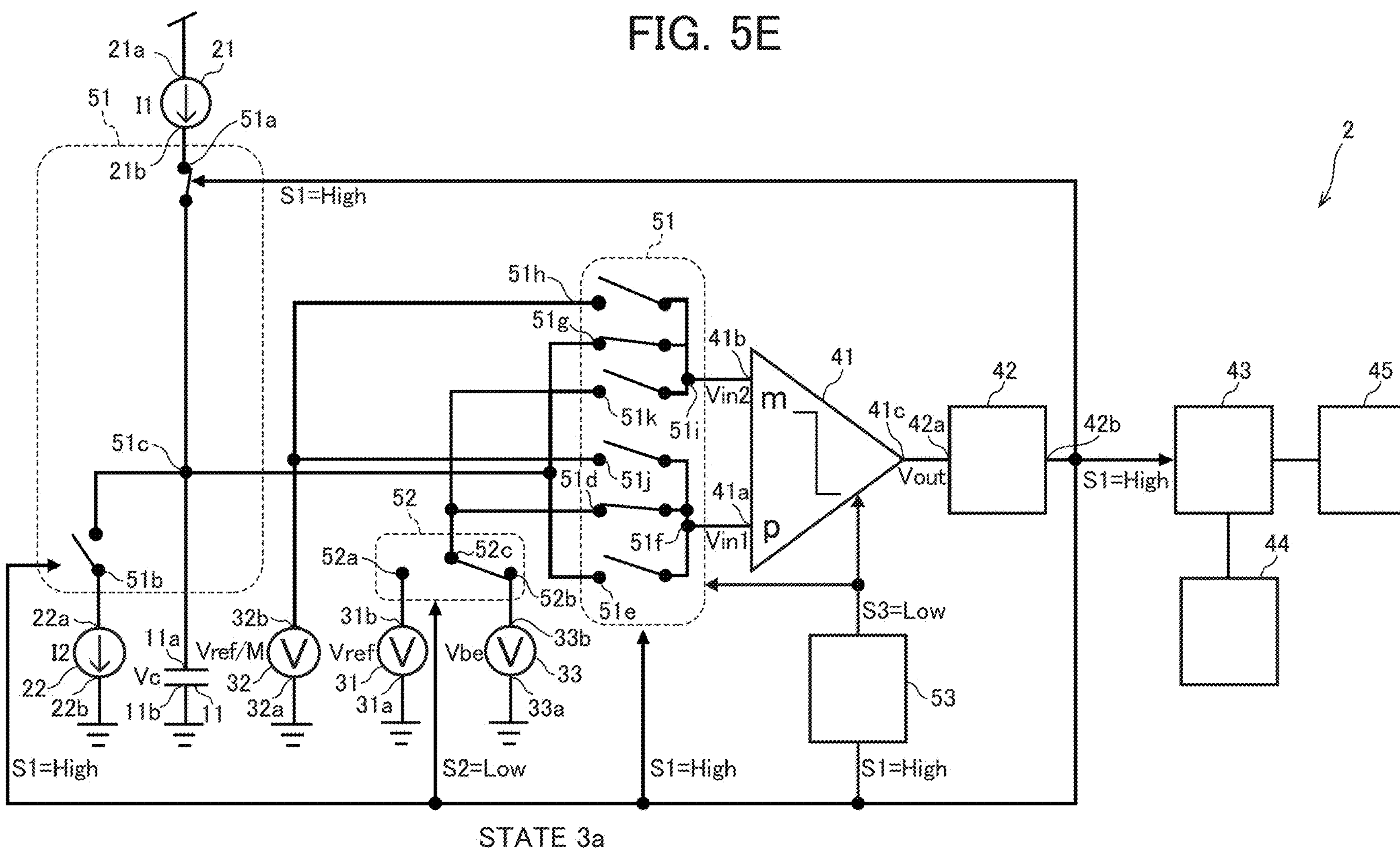
FIG. 5E is a circuit diagram illustrating the temperature measuring circuit in State 3*a* according to the second embodiment.
Figure 5F:
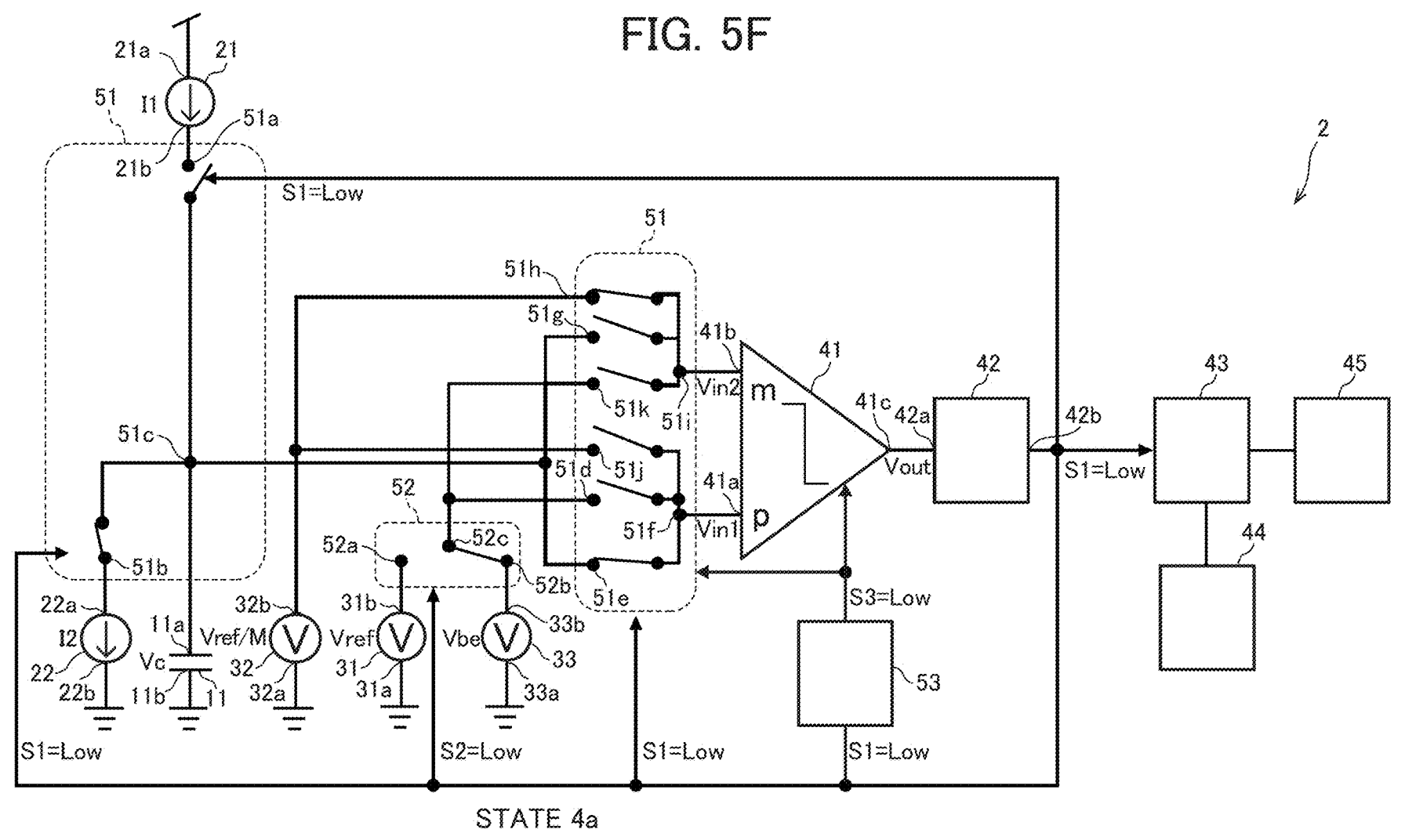
Figure 5G:
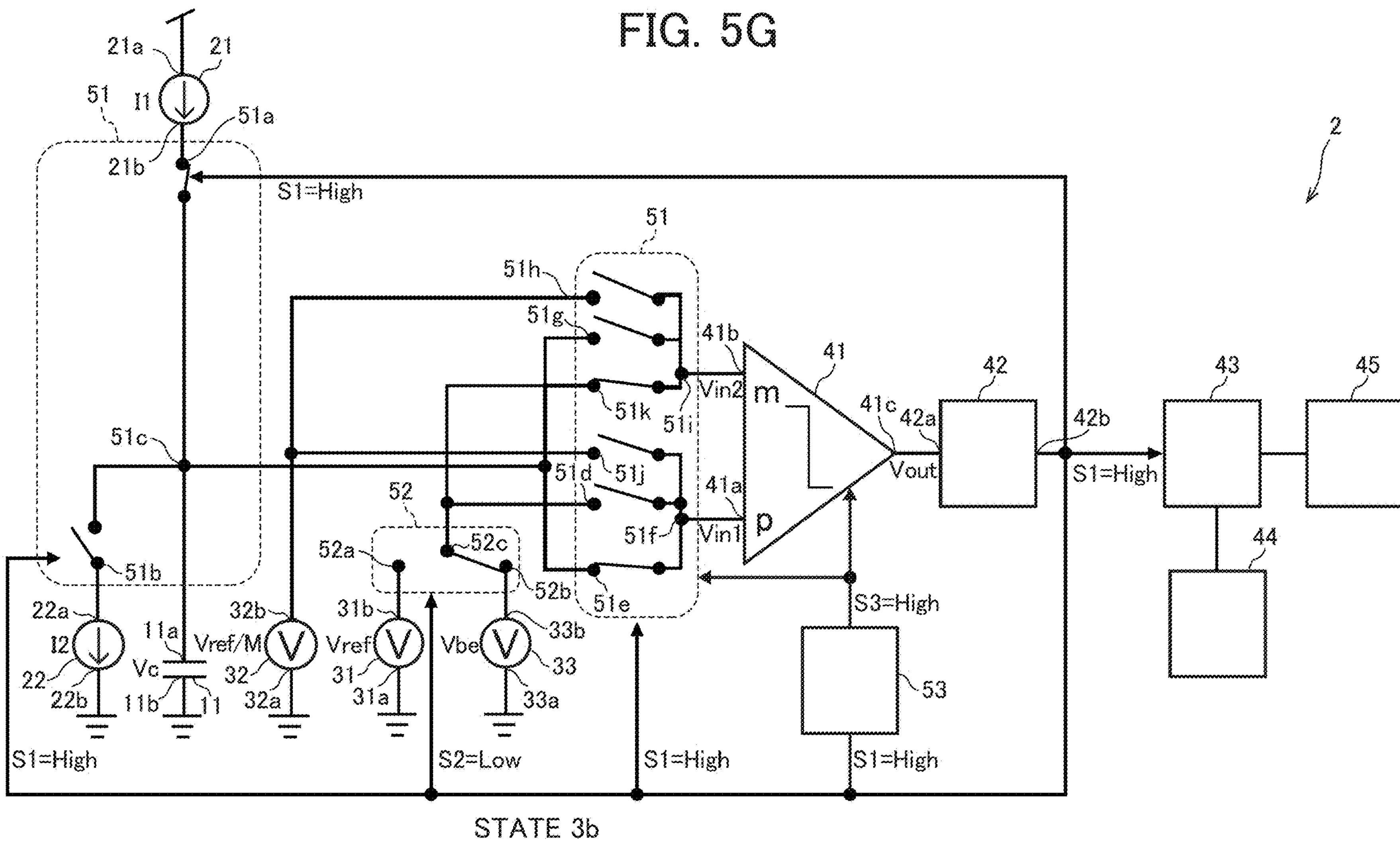
FIG. 5G is a circuit diagram illustrating the temperature measuring circuit in State 3*b* according to the second embodiment.
Figure 5H:
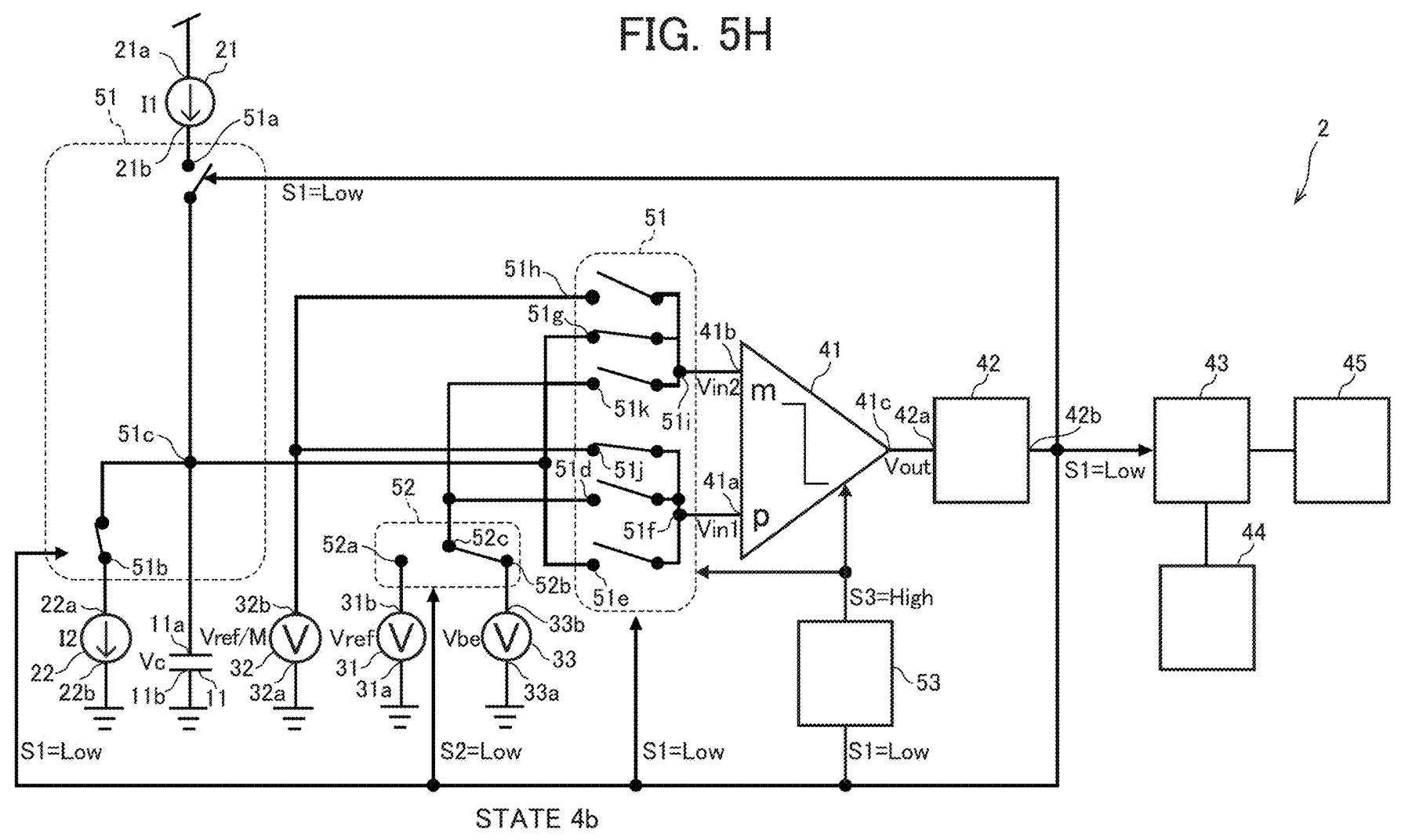

FIG. 5A is a circuit diagram illustrating a temperature measuring circuit in State 1*b* according to the second embodiment. FIG. 5B is a circuit diagram illustrating the temperature measuring circuit in State 2*a* according to the second embodiment. FIG. 5C is a circuit diagram illustrating the temperature measuring circuit in State 1*b* according to the second embodiment. FIG. 5D is a circuit diagram illustrating the temperature measuring circuit in State 2*b* according to the second embodiment. FIG. 5E is a circuit diagram illustrating the temperature measuring circuit in State 3*a* according to the second embodiment. FIG. 5F is a circuit diagram illustrating the temperature measuring circuit in State 4*a* according to the second embodiment. FIG. 5G is a circuit diagram illustrating the temperature measuring circuit in State 3*b* according to the second embodiment. FIG. 5H is a circuit diagram illustrating the temperature measuring circuit in State 4*b* according to the second embodiment.

The temperature measuring circuit, 2, according to the second embodiment illustrated in FIGS. 5A to 5H includes a switching control circuit 53.

The switching control circuit 53 receives the control signal S1 output from the output terminal 42*b* of the control circuit 42. The switching control circuit 53 divides the received control signal S1 and outputs a control signal S3. The switching control circuit 53 outputs the first control signal High or the second control signal Low as the control signal S3. The switching control circuit 53 sets the frequency of a change in the outgoing control signal S3 between the first control signal High and the second control signal Low, at 1/N of the frequency of a change in the received control signal S1 between the first control signal High and the second control signal Low. Here, N is an integer equal to or greater than 2. The switching control circuit 53 changes the outgoing control signal S3 from the first control signal High to the second control signal Low when the control signal S1 received with the outgoing control signal S3 being the first control signal High is set at the first control signal High by the setpoint N. The switching control circuit 53 changes the outgoing control signal S3 from the second control signal Low to the first control signal High when the control signal S1 received with the outgoing control signal S3 being the second control signal Low is set at the first control signal High by the setpoint N. The switching control circuit 53 is formed from a flip-flop circuit or other circuits.

The comparator circuit 41 in the temperature measuring circuit 2 receives the control signal S3 output from the switching control circuit 53. The comparator circuit 41 sets its first input terminal 41*a* and second input terminal 41*b* as a non-inverting input terminal and an inverting input terminal, respectively, while the received control signal S3 is the second control signal Low. The comparator circuit 41 sets its first input terminal 41*a* and second input terminal 41*b* as an inverting input terminal and a non-inverting input terminal, respectively, while the received control signal S3 is the first control signal High. Thus, while the received control signal S3 is the second control signal Low, the comparator circuit 41 sets the output voltage Vout at the first output voltage High in response to the first input voltage Vin1 higher than the second input voltage Vin2, and the comparator circuit 41 sets as the output voltage Vout at the second output voltage Low in response to the first input voltage Vin1 lower than the second input voltage Vin2. Further, while the received control signal S3 is the first control signal High, the comparator circuit 41 sets the output voltage Vout at the second output voltage Low in response to the first input voltage Vin1 higher than the second input voltage Vin2, and the comparator circuit 41 sets the output voltage Vout at the first output voltage High in response to the first input voltage Vin1 lower than the second input voltage Vin2.

The first switch circuit 51 in the temperature measuring circuit 2 includes terminals 51*j* and 51*k*, as illustrated in FIGS. 5A through 5H.

The terminal 51*j* of the first switch circuit 51 is electrically connected to the positive electrode 32*b* of the second voltage supply 32. The terminal 51*k* of the first switch circuit 51 is electrically connected to the terminal 52*c* of the second switch circuit 52.

The first switch circuit 51 receives the control signal S3 output from the switching control circuit 53.

Upon receiving the control signal S1 being the first control signal High, and receiving the control signal S3 being the second control signal Low, the first switch circuit 51 brings its terminal 51*d* into electrical continuity with its terminal 51*f* and does not bring its terminals 51*e* and 51*j* into electrical continuity with its terminal 51*f*, as illustrated in FIGS. 5A and 5E. The first switch circuit 51 thus sets the first input voltage Vin1 at the reference voltage Vref or Vbe selected by the second switch circuit 52.

Upon receiving the control signal S1 being the second control signal Low, and receiving the control signal S3 being the second control signal Low, the first switch circuit 51 brings its terminal 51*e* into electrical continuity with its terminal 51*f* and does not bring its terminals 51*d* and 51*j* into electrical continuity with its terminal 51*f*, as illustrated in FIGS. 5B and 5F. The first switch circuit 51 thus sets the first input voltage Vin1 at the inter-terminal voltage Vc generated by the capacitor 11.

Upon receiving the control signal S1 being the first control signal High, and receiving the control signal S3 being the first control signal High, the first switch circuit 51 brings its terminal 51*e* into electrical continuity with its terminal 51*f* and does not bring its terminals 51*d* and 51*j* into electrical continuity with its terminal 51*f*, as illustrated in FIGS. 5C and 5G. The first switch circuit 51 thus sets the first input voltage Vin1 at the inter-terminal voltage Vc generated by the capacitor 11.

Upon receiving the control signal S1 being the second control signal Low, and receiving the control signal S3 being the first control signal High, the first switch circuit 51 brings its terminal 51*j* into electrical continuity with its terminal 51*f* and does not bring its terminals 51*d* and 51*e* into electrical continuity with its terminal 51*f*, as illustrated in FIGS. 5D and 5H. The first switch circuit 51 thus sets the first input voltage Vin1 at the second reference voltage Vref/M generated by the second voltage supply 32.

Upon receiving the control signal S1 being the first control signal High, and receiving the control signal S3 being the second control signal Low, the first switch circuit 51 brings its terminal 51*g* into electrical continuity with its terminal 51*i* and does not bring its terminals 51*h* and 51*k* into electrical continuity with its terminal 51*i*, as illustrated in FIGS. 5A and 5E. The first switch circuit 51 thus sets the second input voltage Vin2 at the inter-terminal voltage Vc generated by the capacitor 11.

Upon receiving the control signal S1 being the second control signal Low, and receiving the control signal S3 being the second control signal Low, the first switch circuit 51 brings its terminal 51*h* into electrical continuity with its terminal 51*i* and does not bring its terminals 51*g* and 51*k* into electrical continuity with its terminal 51*i*, as illustrated in FIGS. 5B and 5F. The first switch circuit 51 thus sets the second input voltage Vin2 at the second reference voltage Vref/M generated by the second voltage supply 32.

Upon receiving the control signal S1 being the first control signal High, and receiving the control signal S3 being the first control signal High, the first switch circuit 51 brings its terminal 51*k* into electrical continuity with its terminal 51*i* and does not bring its terminals 51*g* and 51*h* into electrical continuity with its terminal 51*i*, as illustrated in FIGS. 5C and 5G. The first switch circuit 51 thus sets the second input voltage Vin2 at the reference voltage Vref or Vbe selected by the second switch circuit 52.

Upon receiving the control signal S1 being the second control signal Low, and receiving the control signal S3 being the first control signal High, the first switch circuit 51 brings its terminal 51*g* into electrical continuity with its terminal 51*i* and does not bring its terminals 51*h* and 51*k* into electrical continuity with its terminal 51*i*, as illustrated in FIGS. 5D and 5H. The first switch circuit 51 thus sets the second input voltage Vin2 at the inter-terminal voltage Vc generated by the capacitor 11.

As described above, upon receiving the control signal S1 being the first control signal High, and receiving the control signal S3 being the second control signal Low, the first switch circuit 51 sets the two input voltages Vin1 and Vin2, which are compared by the comparator circuit 41, at the reference voltage Vref or Vbe, which is selected by the second switch circuit 52, and the inter-terminal voltage Vc, which is generated by the comparator circuit 11. Upon receiving the control signal S1 being the second control signal Low, and receiving the control signal S3 being the second control signal Low, the first switch circuit 51 sets the two input voltages Vin1 and Vin2, which are compared by the comparator circuit 41, at the inter-terminal voltage Vc, which is generated by the capacitor 11, and the second reference voltage Vref/M, which is generated by the second voltage supply 32. Upon receiving the control signal S1 being the first control signal High, and receiving the control signal S3 being the first control signal High, the first switch circuit 51 sets the two input voltages Vin1 and Vin2, which are compared by the comparator circuit 41, at the inter-terminal voltage Vc, which is generated by the comparator circuit 11, and the reference voltage Vref or Vbe, which is selected by the second switch circuit 52. Upon receiving the control signal S1 being the second control signal Low, and receiving the control signal S3 being the first control signal High, the first switch circuit 51 sets the two input voltages Vin1 and Vin2, which are compared by the comparator circuit 41, at the second reference voltage Vref/M, which is generated by the capacitor 32, and the inter-terminal voltage Vc, which is generated by the second voltage supply 11.

2.2 Comparator Circuit

Figure 6A:
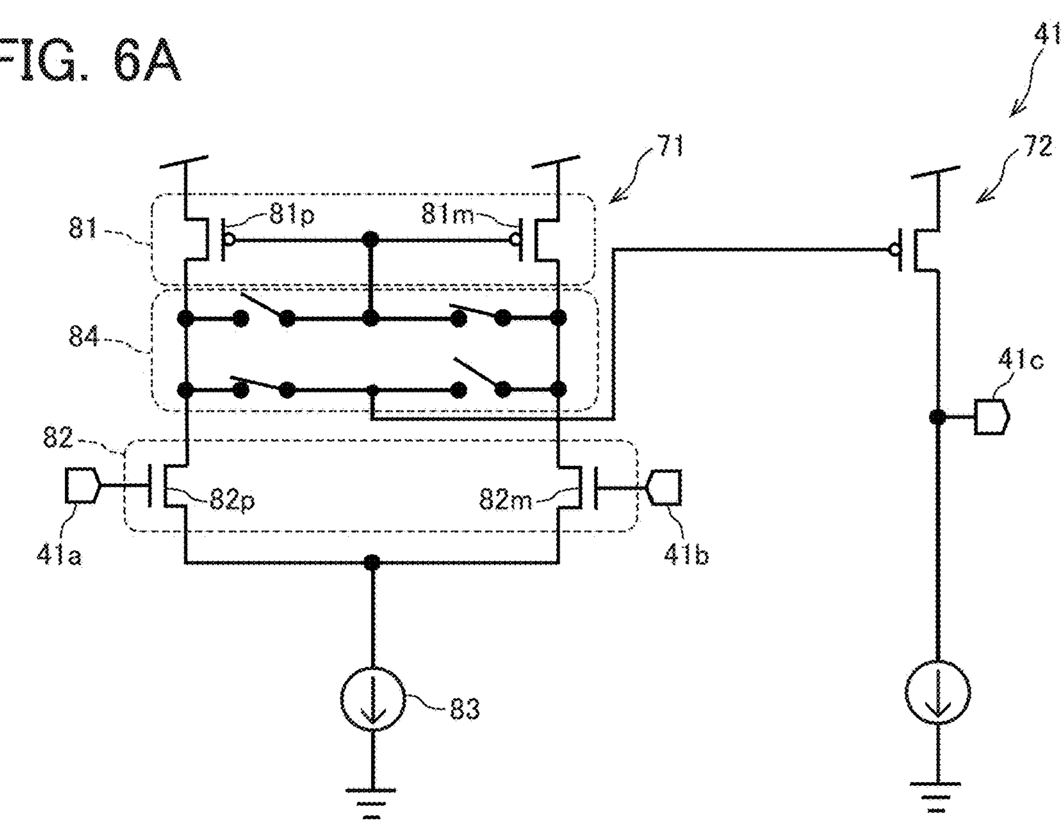
FIG. 6A is a circuit diagram illustrating a comparator circuit, which is provided in the temperature measuring circuit according to the second embodiment, with its first and second input terminals being a non-inverting input terminal and an inverting input terminal, respectively.
Figure 6B:
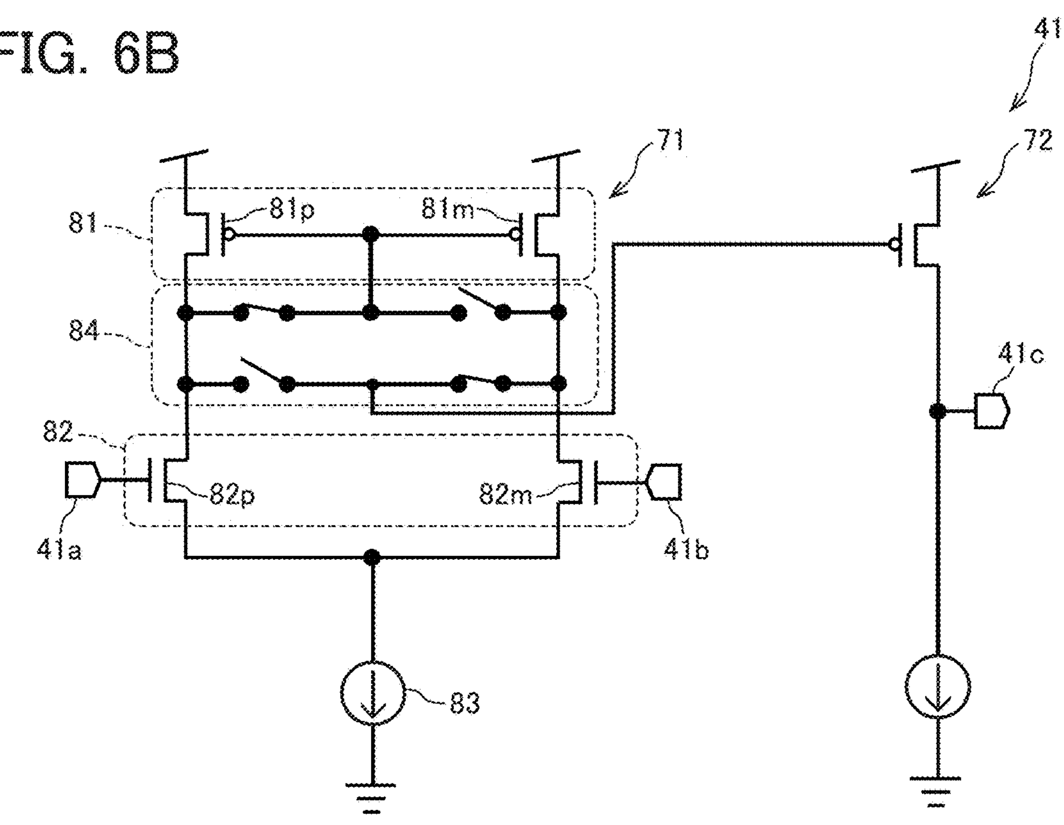
FIG. 6B is a circuit diagram illustrating the comparator circuit, which is provided in the temperature measuring circuit according to the second embodiment, with its first and second input terminals being an inverting input terminal and a non-inverting input terminal, respectively.

FIG. 6A is a circuit diagram illustrating the comparator circuit, which is provided in the temperature measuring circuit according to the second embodiment, with its first and second input terminals being a non-inverting input terminal and an inverting input terminal, respectively. FIG. 6B is a circuit diagram illustrating the comparator circuit, which is provided in the temperature measuring circuit according to the second embodiment, with its first and second input terminals being an inverting input terminal and a non-inverting input terminal, respectively.

As illustrated in FIGS. 6A and 6B, the comparator circuit 41 includes a differential input circuit 71 and an output circuit 72. The differential input circuit 71 includes a mirror pair 81, a differential pair 82, a constant-current supply 83, and a switching circuit 84. The mirror pair 81 has active elements 81*p* and 81*m*. The differential pair 82 has active elements 82*p* and 82*m*. The active elements 81*p*, 81*m*, 82*p*, and 82*m* are metal oxide semiconductor field-effect transistors (MOSFETs). The active elements 81*p*, 81*m*, 82*p*, and 82*m* may be active elements other than MOSFETs.

The mirror pair 81 feeds a reference current through one of the active elements 81*p* and 81*m* and feeds a current that is a duplicate of the reference current through the other of the active elements 81*p* and 81*m*.

The differential pair 82 feeds, through the active element 82*p*, a current corresponding to the first input voltage Vin1 input to the first input terminal 41*a* of the comparator circuit 41 and feeds, through the active element 82*m*, a current corresponding to the second input voltage Vin2 input to the second input terminal 41*b* of the comparator circuit 41. The current fed through the active element 82*p* includes the current fed through the active element 81*p*. The current fed through the active element 82*m* includes the current fed through the active element 81*m*.

The constant-current supply 83 feeds a constant current. The constant current fed by the constant-current supply 83 is a current that is a merge of the current fed through the active element 82*p* and the current fed through the active element 82*m*.

The switching circuit 84 receives the control signal S3. Upon receiving the control signal S3 being the second control signal Low, the switching circuit 84 brings the active element 81*m* into diode connection to feed the reference current through the active element 81*m* and feeds the duplicate of the reference current through the active element 81*p*, as illustrated in FIG. 6A. Upon receiving the control signal S3 being the second control signal Low, the switching circuit 84 also connects the output circuit 72 electrically to the active element 82*p* to feed, through the active element 82*p*, a current that is a merge of the current flowing into the active element 81*p* and current flowing out of the output circuit 72. Upon receiving the control signal S3 being the first control signal High, the switching circuit 84 brings the active element 81*p* into diode connection to feed the reference current through the active element 81*p* and feeds the duplicate of the reference current through the active element 81*m*, as illustrated in FIG. 6B. Upon receiving the control signal S3 being the first control signal High, the switching circuit 84 also connects the output circuit 72 electrically to the active element 82*m* to feed, through the active element 82*m*, a current that is a merge of the current flowing into the active element 81*m* and the current flowing out of the output circuit 72.

The output circuit 72 outputs the output voltage Vout corresponding to an outgoing current, from the output terminal 41*c* of the comparator circuit 41.

As described above, the switching circuit 84 sets the first input terminal 41*a* and second input terminal 41*b* of the comparator circuit 41 as a non-inverting input terminal and an inverting input terminal, respectively, while the control signal S3 is the second control signal Low, and the switching circuit 84 sets the first input terminal 41*a* and second input terminal 41*b* of the comparator circuit 41 as an inverting input terminal and a non-inverting input terminal, respectively, while the received control signal S3 is the first control signal High. Thus, while the control signal S3 is the second control signal Low, the switching circuit 84 sets the output voltage Vout at the first output voltage High in response to the first input voltage Vin1 higher than the second input voltage Vin2, and the switching circuit 84 sets the output voltage Vou at the second control signal Low in response to the first input voltage Vin1 lower than the second input voltage Vin2. Further, while the control signal S3 is the first control signal High, the switching circuit 84 sets the output voltage Vout at the second output voltage Low in response to the first input voltage Vin1 higher than the second input voltage Vin2, and the switching circuit 84 sets the output voltage Vout at the first output voltage High in response to the first input voltage Vin1 lower than the second input voltage Vin2.

2.3 Operation of Temperature Measuring Circuit

Figure 7A:
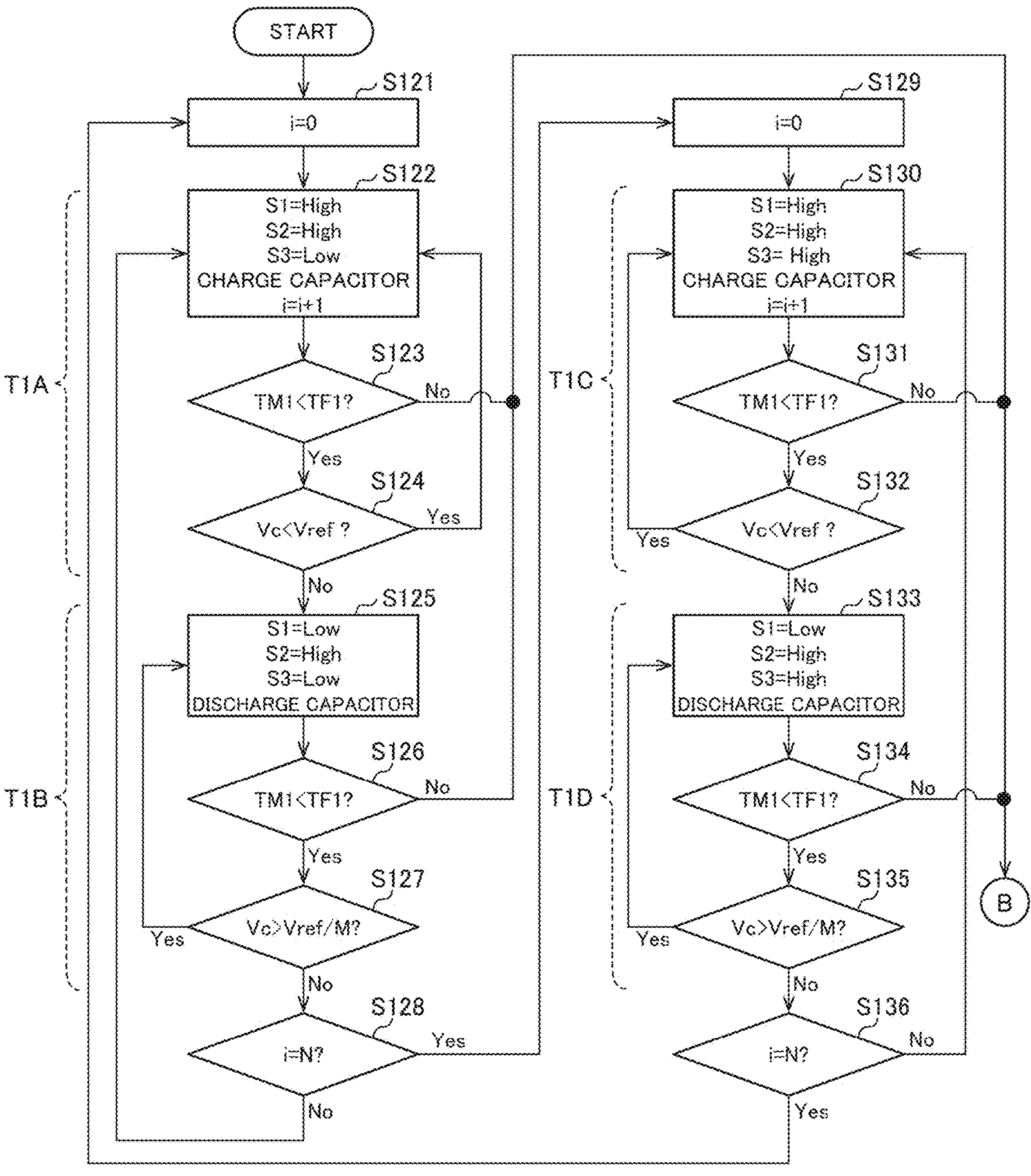
FIG. 7A is a flowchart showing the operation of the temperature measuring circuit according to the second embodiment.
Figure 7B:
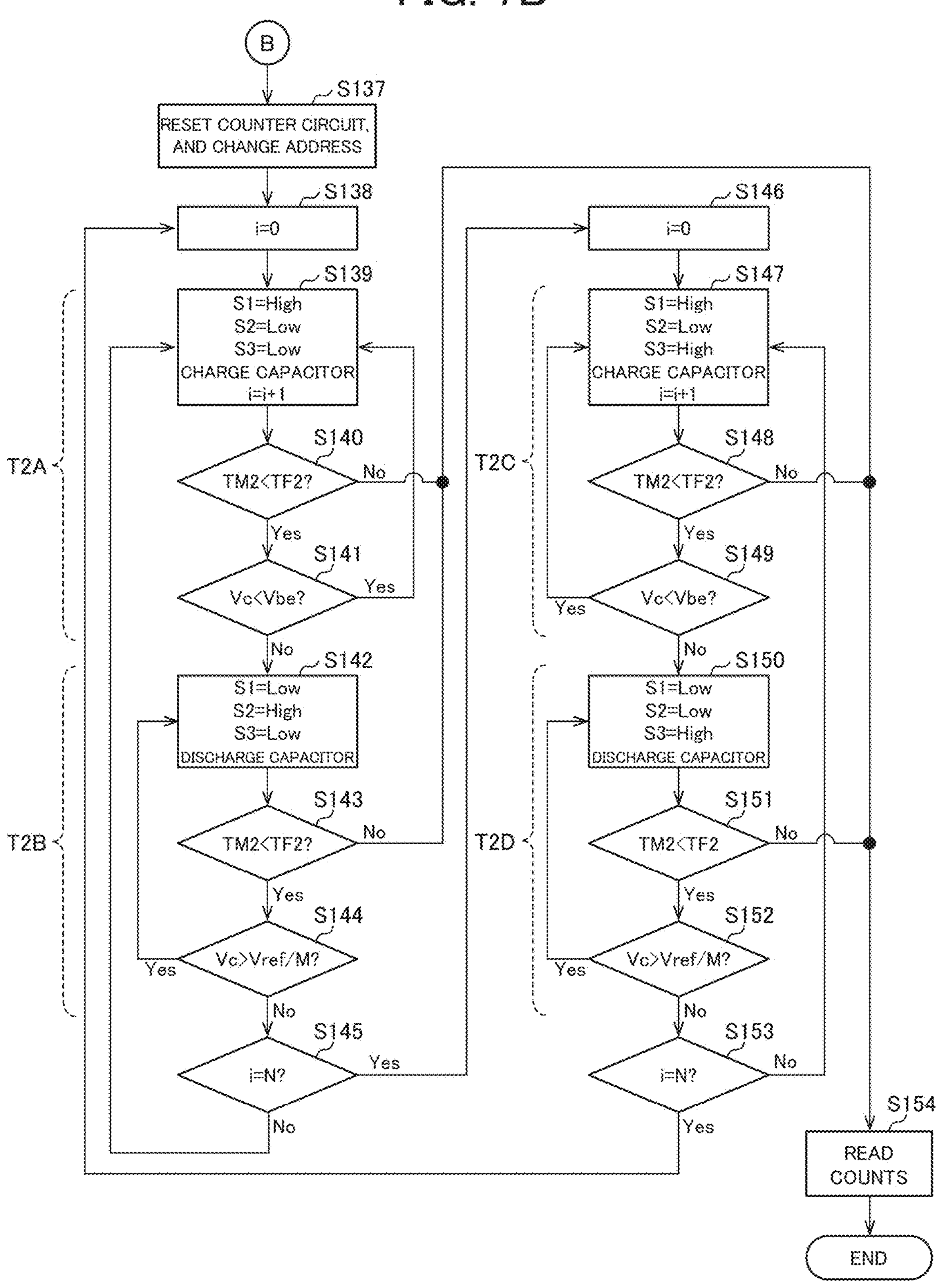
FIG. 7B is a flowchart showing the operation of the temperature measuring circuit according to the second embodiment.

FIGS. 7A and 7B are flowcharts showing the operation of the temperature measuring circuit according to the second embodiment.

The temperature measuring circuit 2 executes Steps S121 to S154 shown in FIGS. 7A and 7B.

The temperature measuring circuit 2 executes Steps S121 to S136 during the first period T1 to turn alternately into State 1*a* illustrated in FIG. 5A and State 2*a* illustrated in FIG. 5B, or turn alternately into State 1*b* illustrated in FIG. 5C and State 2*b* illustrated FIG. 5D. The temperature measuring circuit 2 executes Steps S138 to S153 during the subsequent second period T2 to turn alternately into State 3*a* illustrated in FIG. 5E and State 4*a* illustrated in FIG. 5F, or turn alternately into State 3*b* illustrated in FIG. 5G and State 4*b* illustrated FIG. 5H.

The temperature measuring circuit 2 executes Steps S122 to S124 during the period T1A, which is included in the first period T1, to turn into State 1*a* illustrated in FIG. 5A. The temperature measuring circuit 2 executes Steps S125 to S127 during the period T1B, which is included in the first period T1, to turn into State 2*a* illustrated in FIG. 5B. The temperature measuring circuit 2 executes Steps S130 to S132 during a period TIC, which is included in the first period T1, to turn into State 1*b* illustrated in FIG. 5C. The temperature measuring circuit 2 executes Steps S133 to S135 during a period T1D, which is included in the first period T1, to turn into State 2*b* illustrated in FIG. 5D.

The temperature measuring circuit 2 executes Steps S139 to S141 during the period T2A, which is included in the second period T2, to turn into State 3*a* illustrated in FIG. 5E. The temperature measuring circuit 2 executes Steps S142 to S144 during the period T2B, which is included in the second period T2, to turn into State 4*a* illustrated in FIG. 5F. The temperature measuring circuit 2 executes Steps S147 to S149 during a period T2C, which is included in the second period T2, to turn into State 3*b* illustrated in FIG. 5G. The temperature measuring circuit 2 executes Steps S150 to S152 during a period T2D, which is included in the second period T2, to turn into State 4*b* illustrated in FIG. 5H.

Initialization of Measurement Number

In Step S121, the switching control circuit 53 initializes a measurement number i to zero. The measurement number i denotes how many times the control signal S1 has been set at the first control signal High.

Charge During Period T1A

In subsequent Step S122, as illustrated in FIG. 5A, the control circuit 42 sets the control signal S1 at the first control signal High and sets the control signal S2 at the first control signal High. In addition, the switching control circuit 53 sets the control signal S3 at the second control signal Low. The switching control circuit 53 also increments the measurement number i.

Accordingly, the positive electrode 21*b* of the first current supply 21 is electrically connected to the terminal 11*a* of the capacitor 11. Further, the first input terminal 41*a* of the comparator circuit 41 is electrically connected to the positive electrode 31$b$ of the first voltage supply 31. Further, the second input terminal 41$b$ of the comparator circuit 41 is electrically connected to the terminal 11$a$ of the capacitor 11. Further, the first input terminal 41$a$ and second input terminal 41$b$ of the comparator circuit 41 are set as a non-inverting input terminal and an inverting input terminal, respectively. Accordingly, the non-inverting input terminal of the comparator circuit 41 is electrically connected to the positive electrode 31$b$ of the first voltage supply 31. In addition, the inverting input terminal of the comparator circuit 41 is electrically connected to the terminal 11$a$ of the capacitor 11.

Accordingly, the first current supply 21 charges the capacitor 11. Further, the comparator circuit 41 compares the first reference voltage Vref and the inter-terminal voltage Vc and sets the output voltage Vout at the first output voltage High.

In subsequent Step S123, the control circuit 42 determines whether the time TM1 elapsed from the start of the first period T1 is shorter than the first measurement time TF1. If determining that the time TM1 is shorter than the first measurement time TF1, the control circuit 42 executes Step S124. If determining that the time TM1 is equal to or longer than the first measurement time TF1, the control circuit 42 executes Step S137.

In Step S124, the control circuit 42 determines whether the inter-terminal voltage Vc is lower than the first reference voltage Vref on the basis of the output voltage Vout. If determining that the inter-terminal voltage Vc is lower than the first reference voltage Vref, the control circuit 42 executes Step S122. If determining that the inter-terminal voltage Vc is equal to or higher than the first reference voltage Vref, the control circuit 42 executes Step S125.

From Steps S122 to S124, the control circuit 42 causes the first current supply 21 to continue charging the capacitor 11 and causes the comparator circuit 41 to continue comparing the first reference voltage Vref and the inter-terminal voltage Vc until the time TM1 reaches the first measurement time TF1, or until the inter-terminal voltage Vc rises to the first reference voltage Vref. The control circuit 42 ends the first period T1 and starts the second period T2 in synchronization with that the time TM1 reaches the first measurement time TF1. The control circuit 42 ends the period T1A and starts the period T1B in synchronization with that the inter-terminal voltage Vc rises to the first reference voltage Vref, and that the output voltage Vout changes from the first output voltage High to the second output voltage Low.

Discharge During Period T1B

In Step S125, as illustrated in FIG. 5B, the control circuit 42 sets the control signal S1 at the second control signal Low and sets the control signal S2 at the first control signal High. The control circuit 42 may set the control signal S2 at the second control signal Low. In addition, the switching control circuit 53 sets the control signal S3 at the second control signal Low.

Accordingly, the negative electrode 22$a$ of the second current supply 22 is electrically connected to the terminal 11$a$ of the capacitor 11. Further, the first input terminal 41$a$ of the comparator circuit 41 is electrically connected to the terminal 11$a$ of the capacitor 11. Further, the second input terminal 41$b$ of the comparator circuit 41 is electrically connected to the positive electrode 32$b$ of the second voltage supply 32. Further, the first input terminal 41$a$ and second input terminal 41$b$ of the comparator circuit 41 are set as a non-inverting input terminal and an inverting input terminal, respectively. Accordingly, the non-inverting input terminal of the comparator circuit 41 is electrically connected to the terminal 11$a$ of the capacitor 11. In addition, the inverting input terminal of the comparator circuit 41 is electrically connected to the positive electrode 32$b$ of the second voltage supply 32.

Accordingly, the second current supply 22 discharges the capacitor 11. Further, the comparator circuit 41 compares the inter-terminal voltage Vc and the second reference voltage Vref/M and sets the output voltage Vout at the first output voltage High.

In subsequent Step S126, the control circuit 42 determines whether the time TM1 is shorter than the first measurement time TF1. If determining that the time TM1 is shorter than the first measurement time TF1, the control circuit 42 executes Step S127. If determining that the time TM1 is equal to or longer than the first measurement time TF1, the control circuit 42 executes Step S137.

In Step S127, the control circuit 42 determines whether the inter-terminal voltage Vc is higher than the second reference voltage Vref/M on the basis of the output voltage Vout. If determining that the inter-terminal voltage Vc is higher than the second reference voltage Vref/M, the control circuit 42 executes Step S125. If determining that the inter-terminal voltage Vc is equal to or lower than the second reference voltage Vref/M, the control circuit 42 executes Step S128.

From Steps S125 to S127, the control circuit 42 causes the second current supply 22 to continue discharging the capacitor 11 and causes the comparator circuit 41 to continue comparing the inter-terminal voltage Vc and the second reference voltage Vref/M until the time TM1 reaches the first measurement time TF1, or until the inter-terminal voltage Vc lowers to the second reference voltage Vref/M. The control circuit 42 ends the first period T1 and starts the second period T2 in synchronization with that the time TM1 reaches the first measurement time TF1. The control circuit 42 ends the period T1B and starts the period T1A or TIC in synchronization with that the inter-terminal voltage Vc lowers to the second reference voltage Vref/M, and that the output voltage Vout changes from the first output voltage High to the second output voltage Low.

Determination of Measurement Number

In Step S128, the switching control circuit 53 determines whether the measurement number i has reached the setpoint N. If determining that the measurement number i has reached the setpoint N, the switching control circuit 53 executes Step S129. If determining that the measurement number i has not yet reached the setpoint N, the switching control circuit 53 executes Step S122.

From Steps S121 to S128, until the measurement number i reaches the setpoint N, the control circuit 42 alternately performs the following two kinds of operations: one is causing the first current supply 21 to charge the capacitor 11, and causing the comparator circuit 41 to compare the inter-terminal voltage Vc and the first reference voltage Vref, and the other is causing the second current supply 22 to discharge the capacitor 11, and causing the comparator circuit 41 to compare the inter-terminal voltage Vc and the second reference voltage Vref/M. The control circuit 42 ends the period T1B and starts the period TIC in synchronization with that the measurement number i reaches the setpoint N.

Initialization of Measurement Number

In Step S129, the switching control circuit 53 initializes the measurement number i to zero.

Charge During Period TIC

In subsequent Step S130, as illustrated in FIG. 5C, the control circuit 42 sets the control signal S1 at the first control signal High and sets the control signal S2 at the first control signal High. In addition, the switching control circuit 53 sets the control signal S3 at the first control signal High. The switching control circuit 53 also increments the measurement number i.

Accordingly, the positive electrode 21*b* of the first current supply 21 is electrically connected to the terminal 11*a* of the capacitor 11. Further, the first input terminal 41*a* of the comparator circuit 41 is electrically connected to the terminal 11*a* of the capacitor 11. Further, the second input terminal 41*b* of the comparator circuit 41 is electrically connected to the positive electrode 31*b* of the first voltage supply 31. Further, the first input terminal 41*a* and second input terminal 41*b* of the comparator circuit 41 are set as an inverting input terminal and a non-inverting input terminal, respectively. Accordingly, like in Step S122, the non-inverting input terminal of the comparator circuit 41 is electrically connected to the positive electrode 31*b* of the first voltage supply 31. In addition, the inverting input terminal of the comparator circuit 41 is electrically connected to the terminal 11*a* of the capacitor 11.

Accordingly, the first current supply 21 charges the capacitor 11. Further, the comparator circuit 41 compares the first reference voltage Vref and the inter-terminal voltage Vc and sets the output voltage Vout at the first output voltage High.

In subsequent Step S131, the control circuit 42 determines whether the time TM1 elapsed from the start of the first period T1 is shorter than the first measurement time TF1. If determining that the time TM1 is shorter than the first measurement time TF1, the control circuit 42 executes Step S132. If determining that the time TM1 is equal to or longer than the first measurement time TF1, the control circuit 42 executes Step S137.

In Step S132, the control circuit 42 determines whether the inter-terminal voltage Vc is lower than the first reference voltage Vref on the basis of the output voltage Vout. If determining that the inter-terminal voltage Vc is lower than the first reference voltage Vref, the control circuit 42 executes Step S130. If determining that the inter-terminal voltage Vc is equal to or higher than the first reference voltage Vref, the control circuit 42 executes Step S133.

From Steps S130 to S132, the control circuit 42 causes the first current supply 21 to continue charging the capacitor 11 and causes the comparator circuit 41 to continue comparing the first reference voltage Vref and the inter-terminal voltage Vc until the time TM1 reaches the first measurement time TF1, or until the inter-terminal voltage Vc rises to the first reference voltage Vref. The control circuit 42 ends the first period T1 and starts the second period T2 in synchronization with that the time TM1 reaches the first measurement time TF1. The control circuit 42 ends the period TIC and starts the period T1D in synchronization with that the inter-terminal voltage Vc rises to the first reference voltage Vref, and that the output voltage Vout changes from the first output voltage High to the second output voltage Low.

Discharge During Period T1D

In Step S133, the control circuit 42 sets the control signal S1 at the second control signal Low and sets the control signal S2 at the first control signal High. The control circuit 42 may set the control signal S2 at the second control signal Low. In addition, the switching control circuit 53 sets the control signal S3 at the first control signal High.

Accordingly, the negative electrode 22*a* of the second current supply 22 is electrically connected to the terminal 11*a* of the capacitor 11, as illustrated in FIG. 5D. Further, the first input terminal 41*a* of the comparator circuit 41 is electrically connected to the positive electrode 32*b* of the second voltage supply 32. Further, the second input terminal 41*b* of the comparator circuit 41 is electrically connected to the terminal 11*a* of the capacitor 11. Further, the first input terminal 41*a* and second input terminal 41*b* of the comparator circuit 41 are set as an inverting input terminal and a non-inverting input terminal, respectively. Accordingly, like in Step S125, the non-inverting input terminal of the comparator circuit 41 is electrically connected to the terminal 11*a* of the capacitor 11. In addition, the inverting input terminal of the comparator circuit 41 is electrically connected to the positive electrode 32*b* of the second voltage supply 32.

Accordingly, the second current supply 22 discharges the capacitor 11. Further, the comparator circuit 41 compares the inter-terminal voltage Vc and the second reference voltage Vref/M and sets the output voltage Vout at the first output voltage High.

In subsequent Step S134, the control circuit 42 determines whether the time TM1 is shorter than the first measurement time TF1. If determining that the time TM1 is shorter than the first measurement time TF1, the control circuit 42 executes Step S135. If determining that the time TM1 is equal to or longer than the first measurement time TF1, the control circuit 42 executes Step S137.

In Step S135, the control circuit 42 determines whether the inter-terminal voltage Vc is higher than the second reference voltage Vref/M on the basis of the output voltage Vout. If determining that the inter-terminal voltage Vc is higher than the second reference voltage Vref/M, the control circuit 42 executes Step S133. If determining that the inter-terminal voltage Vc is equal to or lower than the second reference voltage Vref/M, the control circuit 42 executes Step S136.

From Steps S133 to S135, the control circuit 42 causes the second current supply 22 to continue discharging the capacitor 11 and causes the comparator circuit 41 to continue comparing the inter-terminal voltage Vc and the second reference voltage Vref/M until the time TM1 reaches the first measurement time TF1, or until the inter-terminal voltage Vc lowers to the second reference voltage Vref/M. The control circuit 42 ends the first period T1 and starts the second period T2 in synchronization with that the time TM1 reaches the first measurement time TF1. The control circuit 42 ends the period T1D and starts the period TIC in synchronization with that the inter-terminal voltage Vc lowers to the second reference voltage Vref/M, and that the output voltage Vout changes from the first output voltage High to the second output voltage Low.

Determination of Measurement Number

In Step S136, the switching control circuit 53 determines whether the measurement number i has reached the setpoint N. If determining that the measurement number i has reached the setpoint N, the switching control circuit 53 executes Step S121. If determining that the measurement number i has not yet reached the setpoint N, the switching control circuit 53 executes Step S130.

From Steps S129 to S136, until the measurement number i reaches the setpoint N, the control circuit 42 alternately performs the following two kinds of operations: one is causing the first current supply 21 to charge the capacitor 11, and causing the comparator circuit 41 to compare the inter-terminal voltage Vc and the first reference voltage Vref, and the other is causing the second current supply 22 to discharge the capacitor 11, and causing the comparator circuit 41 to compare the inter-terminal voltage Vc and the second reference voltage Vref/M. The control circuit 42 ends the period T1D and starts the period T1A in synchronization with that the measurement number i reaches the setpoint N.

From Steps S121 to S136, during the first period T1, the non-inverting input terminal and inverting input terminal of the comparator circuit 41 are switched, and in synchronization with their switching, the voltages input to the first input terminal 41*a* and second input terminal 41*b* of the comparator circuit 41 are switched. This can cancel the effect of an input offset resulting from variations in an active element. such as a transistor, provided in the comparator circuit 41.

Reset of Counter Circuit and Change of Count Writing Destination

In Step S137, the counter circuit 43 is reset, and the destination into which the foregoing number of periodic changes counted by the counter circuit 43 is written is changed from the first address to the second address.

Initialization of Measurement Number

In Step S138, the switching control circuit 53 initializes the measurement number i to zero.

Charge During Period T2A

In Step S139, as illustrated in FIG. 5E, the control circuit 42 sets the control signal S1 at the first control signal High and sets the control signal S2 at the second control signal Low. In addition, the switching control circuit 53 sets the control signal S3 at the second control signal Low. The switching control circuit 53 also increments the measurement number i.

Accordingly, the positive electrode 21*b* of the first current supply 21 is electrically connected to the terminal 11*a* of the capacitor 11. Further, the first input terminal 41*a* of the comparator circuit 41 is electrically connected to the positive electrode 33*b* of the third voltage supply 33. Further, the second input terminal 41*b* of the comparator circuit 41 is electrically connected to the terminal 11*a* of the capacitor 11. Further, the first input terminal 41*a* and second input terminal 41*b* of the comparator circuit 41 are set as a non-inverting input terminal and an inverting input terminal, respectively. Accordingly, the non-inverting input terminal of the comparator circuit 41 is electrically connected to the positive electrode 33*b* of the third voltage supply 33. In addition, the inverting input terminal of the comparator circuit 41 is electrically connected to the terminal 11*a* of the capacitor 11.

Accordingly, the first current supply 21 charges the capacitor 11. Further, the comparator circuit 41 compares the third reference voltage Vbe and the inter-terminal voltage Vc and sets the output voltage Vout at the first output voltage High.

In subsequent Step S140, the control circuit 42 determines whether the time TM2 elapsed from the start of the second period T2 is shorter than the second measurement time TF2. If determining that the time TM2 is shorter than the second measurement time TF2, the control circuit 42 executes Step S141. If determining that the time TM2 is equal to or longer than the second measurement time TF2, the control circuit 42 executes Step S154.

In Step S141, the control circuit 42 determines whether the inter-terminal voltage Vc is lower than the third reference voltage Vbe on the basis of the output voltage Vout. If determining that the inter-terminal voltage Vc is lower than the third reference voltage Vbe, the control circuit 42 executes Step S139. If determining that the inter-terminal voltage Vc is equal to or higher than the third reference voltage Vbe, the control circuit 42 executes Step S142.

From Steps S139 to S141, the control circuit 42 causes the first current supply 21 to continue charging the capacitor 11 and causes the comparator circuit 41 to continue comparing the third reference voltage Vbe and the inter-terminal voltage Vc until the time TM2 reaches the second measurement time TF2, or until the inter-terminal voltage Vc rises to the third reference voltage Vbe. The control circuit 42 ends the second period T2 in synchronization with that the time TM2 reaches the second measurement time TF2. The control circuit 42 ends the period T2A and starts the period T2B in synchronization with that the inter-terminal voltage Vc rises to the third reference voltage Vbe, and that the output voltage Vout changes from the first output voltage High to the second output voltage Low.

Discharge During Period T2B

In Step S142, the control circuit 42 sets the control signal S1 at the second control signal Low and sets the control signal S2 at the second control signal Low. The control circuit 42 may set the control signal S2 at the first control signal High. In addition, the switching control circuit 53 sets the control signal S3 at the second control signal Low.

Accordingly, the negative electrode 22*a* of the second current supply 22 is electrically connected to the terminal 11*a* of the capacitor 11, as illustrated in FIG. 5F Further, the first input terminal 41*a* of the comparator circuit 41 is electrically connected to the terminal 11*a* of the capacitor 11. Further, the second input terminal 41*b* of the comparator circuit 41 is electrically connected to the positive electrode 32*b* of the second voltage supply 32. Further, the first input terminal 41*a* and second input terminal 41*b* of the comparator circuit 41 are set as a non-inverting input terminal and an inverting input terminal, respectively. Accordingly, the non-inverting input terminal of the comparator circuit 41 is electrically connected to the terminal 11*a* of the capacitor 11. In addition, the inverting input terminal of the comparator circuit 41 is electrically connected to the positive electrode 32*b* of the second voltage supply 32.

Accordingly, the second current supply 22 discharges the capacitor 11. Further, the comparator circuit 41 compares the inter-terminal voltage Vc and the second reference voltage Vref/M and sets the output voltage Vout at the first output voltage High.

In subsequent Step S143, the control circuit 42 determines whether the time TM2 is shorter than the second measurement time TF2. If determining that the time TM2 is shorter than the second measurement time TF2, the control circuit 42 executes Step S144. If determining that the time TM2 is equal to or longer than the second measurement time TF2, the control circuit 42 executes Step S154.

In Step S144, the control circuit 42 determines whether the inter-terminal voltage Vc is higher than the second reference voltage Vref/M on the basis of the output voltage Vout. If determining that the inter-terminal voltage Vc is higher than the second reference voltage Vref/M, the control circuit 42 executes Step S142. If determining that the inter-terminal voltage Vc is equal to or lower than the second reference voltage Vref/M, the control circuit 42 executes Step S145.

From Steps S142 to S144, the control circuit 42 causes the second current supply 22 to continue discharging the capacitor 11 and causes the comparator circuit 41 to continue comparing the inter-terminal voltage Vc and the second reference voltage Vref/M until the time TM2 reaches the second measurement time TF2, or until the inter-terminal voltage Vc lowers to the second reference voltage Vref/M. The control circuit 42 ends the second period T2 in synchronization with that the time TM2 reaches the second measurement time TF2. The control circuit 42 ends the period T2B and starts the period T2A or T2C in synchronization with that the inter-terminal voltage Vc lowers to the second reference voltage Vref/M, and that the output voltage Vout changes from the first output voltage High to the second output voltage Low.

Determination of Measurement Number

In Step S145, the switching control circuit 53 determines whether the measurement number i has reached the setpoint N. If determining that the measurement number i has reached the setpoint N, the switching control circuit 53 executes Step S146. If determining that the measurement number i has not yet reached the setpoint N, the switching control circuit 53 executes Step S139.

From Steps S138 to S145, until the measurement number i reaches the setpoint N, the control circuit 42 alternately performs the following two kinds of operations: one is causing the first current supply 21 to charge the capacitor 11, and causing the comparator circuit 41 to compare the inter-terminal voltage Vc and the third reference voltage Vbe; and the other is causing the second current supply 22 to discharge the capacitor 11, and causing the comparator circuit 41 to compare the inter-terminal voltage Vc and the second reference voltage Vref/M. The control circuit 42 ends the period T2B and starts the period T2C in synchronization with that the measurement number i reaches the setpoint N.

Initialization of Measurement Number

In Step S146, the switching control circuit 53 initializes the measurement number i to zero.

Charge During Period T2C

In Step S147, as illustrated in FIG. 5G, the control circuit 42 sets the control signal S1 at the first control signal High and sets the control signal S2 at the second control signal Low. In addition, the switching control circuit 53 sets the control signal S3 at the first control signal High. The switching control circuit 53 also increments the measurement number i.

Accordingly, the positive electrode 21*b* of the first current supply 21 is electrically connected to the terminal 11*a* of the capacitor 11. Further, the first input terminal 41*a* of the comparator circuit 41 is electrically connected to the terminal 11*a* of the capacitor 11. Further, the second input terminal 41*b* of the comparator circuit 41 is electrically connected to the positive electrode 33*b* of the second voltage supply 33. Further, the first input terminal 41*a* and second input terminal 41*b* of the comparator circuit 41 are set as an inverting input terminal and a non-inverting input terminal, respectively. Accordingly, the non-inverting input terminal of the comparator circuit 41 is electrically connected to the positive electrode 33*b* of the third voltage supply 33. In addition, the inverting input terminal of the comparator circuit 41 is electrically connected to the terminal 11*a* of the capacitor 11.

Accordingly, the first current supply 21 charges the capacitor 11. Further, the comparator circuit 41 compares the third reference voltage Vbe and the inter-terminal voltage Vc and sets the output voltage Vout at the first output voltage High.

In subsequent Step S148, the control circuit 42 determines whether the time TM2 elapsed from the start of the second period T2 is shorter than the second measurement time TF2. If determining that the time TM2 is shorter than the second measurement time TF2, the control circuit 42 executes Step S149. If determining that the time TM2 is equal to or longer than the second measurement time TF2, the control circuit 42 executes Step S154.

In Step S149, the control circuit 42 determines whether the inter-terminal voltage Vc is lower than the third reference voltage Vbe on the basis of the output voltage Vout. If determining that the inter-terminal voltage Vc is lower than the third reference voltage Vbe, the control circuit 42 executes Step S147. If determining that the inter-terminal voltage Vc is equal to or higher than the third reference voltage Vbe, the control circuit 42 executes Step S150.

From Steps S147 to S149, the control circuit 42 causes the first current supply 21 to continue charging the capacitor 11 and causes the comparator circuit 41 to continue comparing the third reference voltage Vbe and the inter-terminal voltage Vc until the time TM2 reaches the second measurement time TF2, or until the inter-terminal voltage Vc rises to the third reference voltage Vbe. The control circuit 42 ends the second period T2 in synchronization with that the time TM2 reaches the second measurement time TF2. The control circuit 42 ends the period T2C and starts the period T2D in synchronization with that the inter-terminal voltage Vc rises to the third reference voltage Vbe, and that the output voltage Vout changes from the first output voltage High to the second output voltage Low.

Discharge During Period T2D

In Step S150, as illustrated in FIG. 5H, the control circuit 42 sets the control signal S1 at the second control signal Low and sets the control signal S2 at the second control signal Low. The control circuit 42 may set the control signal S2 at the first control signal High. In addition, the switching control circuit 53 sets the control signal S3 at the first control signal High.

Accordingly, the negative electrode 22*a* of the second current supply 22 is electrically connected to the terminal 11*a* of the capacitor 11. Further, the first input terminal 41*a* of the comparator circuit 41 is electrically connected to the positive electrode 32*b* of the second voltage supply 32. Further, the second input terminal 41*b* of the comparator circuit 41 is electrically connected to the terminal 11*a* of the capacitor 11. Further, the first input terminal 41*a* and second input terminal 41*b* of the comparator circuit 41 are set as an inverting input terminal and a non-inverting input terminal, respectively. Accordingly, the non-inverting input terminal of the comparator circuit 41 is electrically connected to the terminal 11*a* of the capacitor 11. In addition, the inverting input terminal of the comparator circuit 41 is electrically connected to the positive electrode 32*b* of the second voltage supply 32.

Accordingly, the second current supply 22 discharges the capacitor 11. Further, the comparator circuit 41 compares the inter-terminal voltage Vc and the second reference voltage Vref/M and sets the output voltage Vout at the first output voltage High.

In subsequent Step S151, the control circuit 42 determines whether the time TM2 is shorter than the second measurement time TF2. If determining that the time TM2 is shorter than the second measurement time TF2, the control circuit 42 executes Step S152. If determining that the time TM2 is equal to or longer than the second measurement time TF2, the control circuit 42 executes Step S154.

In Step S152, the control circuit 42 determines whether the inter-terminal voltage Vc is higher than the second reference voltage Vref/M on the basis of the output voltage Vout. If determining that the inter-terminal voltage Vc is higher than the second reference voltage Vref/M, the control circuit 42 executes Step S150. If determining that the inter-terminal voltage Vc is equal to or lower than the second reference voltage Vref/M, the control circuit 42 executes Step S153.

From Steps S150 to S152, the control circuit 42 causes the second current supply 22 to continue discharging the capacitor 11 and causes the comparator circuit 41 to continue comparing the inter-terminal voltage Vc and the second reference voltage Vref/M until the time TM2 reaches the second measurement time TF2, or until the inter-terminal voltage Vc lowers to the second reference voltage Vref/M. The control circuit 42 ends the second period T2 in synchronization with that the time TM2 reaches the second measurement time TF2. The control circuit 42 ends the period T2D and starts the period T2A or T2C in synchronization with that the inter-terminal voltage Vc lowers to the second reference voltage Vref/M, and that the output voltage Vout changes from the first output voltage High to the second output voltage Low.

Determination of Measurement Number

In Step S153, the switching control circuit 53 determines whether the measurement number i has reached the setpoint N. If determining that the measurement number i has reached the setpoint N, the switching control circuit 53 executes Step S138. If determining that the measurement number i has not yet reached the setpoint N, the switching control circuit 53 executes Step S147.

From Steps S146 to S153, until the measurement number i reaches the setpoint N, the control circuit 42 alternately preforms the following two kinds of operations: one is causing the first current supply 21 to charge the capacitor 11, and causing the comparator circuit 41 to compare the inter-terminal voltage Vc and the third reference voltage Vbe; and the other is causing the second current supply 22 to discharge the capacitor 11, and causing the comparator circuit 41 to compare the inter-terminal voltage Vc and the second reference voltage Vref/M.

Counts Readout

In Step S154, the counter circuit 43 reads the counts from the first and second addresses, and from the counts read from the first and second addresses, the counter circuit 43 obtains the first frequency F1 of the control signal S1 during the first period T1, and the second frequency F2 of the control signal S1 during the second period T2. Further, the temperature obtaining unit 45 obtains the temperature on the basis of the first frequency F1 and second frequency F2.

2.4 Time Variations of First Input Voltage, Second Input Voltage, Inter-Terminal Voltage, and Control Signal Time Variations During First Period T1

Figure 8A:
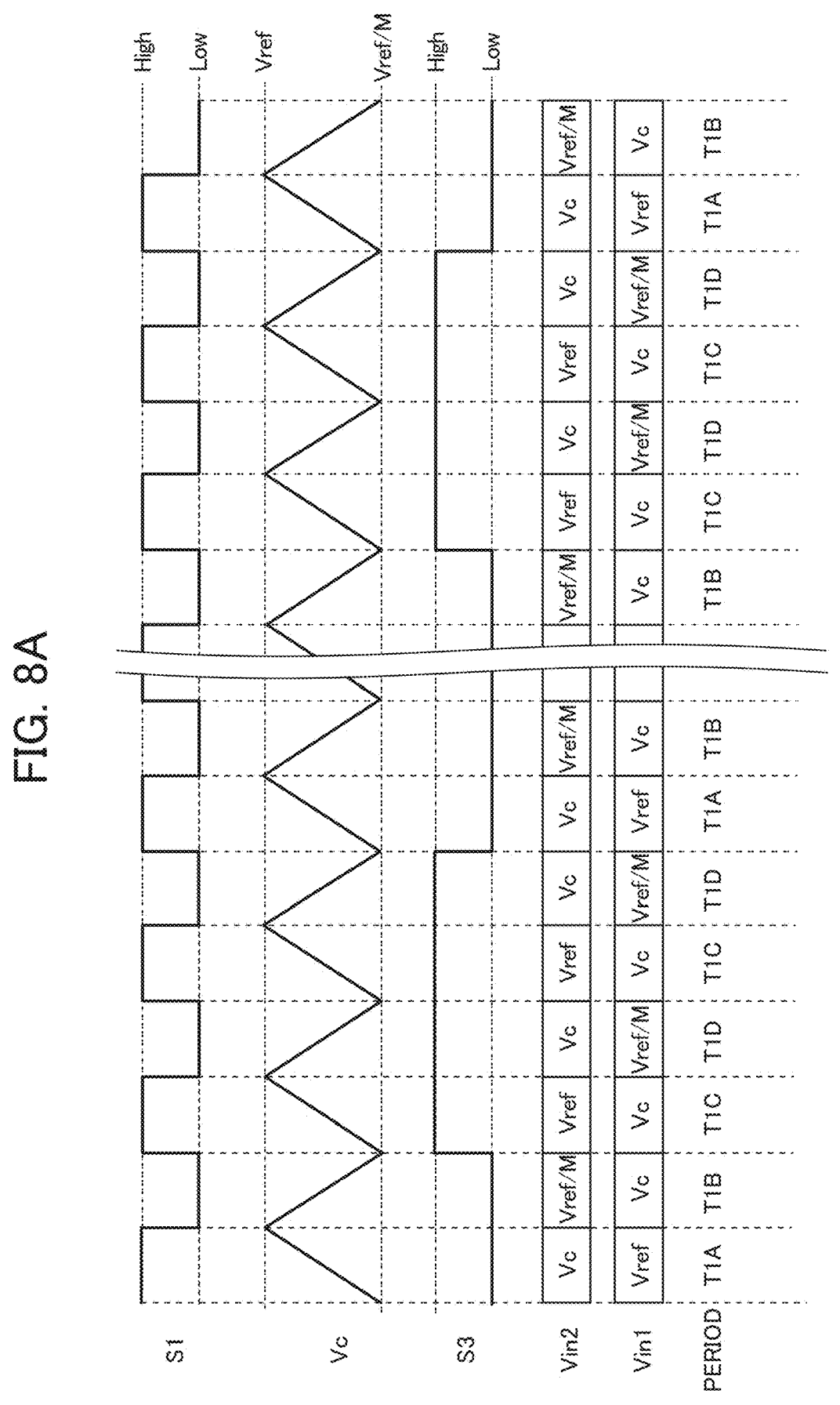

FIG. 8A is a timing chart showing the following time variations during the first period T1: time variations of the first input voltage Vin1 and the second input voltage Vin2, which are input to the comparator provided in the temperature measuring circuit according to the second embodiment; time variations of the inter-terminal voltage Vc, which is generated by the capacitor provided in the temperature measuring circuit; time variations of the control signal S1, which is output by the control circuit provided in the temperature measuring circuit; and time variations of the control signal S3, which is output by the switching control circuit provided in the temperature measuring circuit.

As shown in FIG. 8A, in the temperature measuring circuit 2 in Steps S121 to S136, the periods T1A and T1B come alternately while the control signal S3 during the first period T1 is at the second control signal Low, i.e., while the first input terminal 41*a* and second input terminal 41*b* of the comparator circuit 41 are a non-inverting input terminal and an inverting input terminal, respectively; moreover, the period TIC and T1D come alternately while the control signal S3 during the first period T1 is at the first control signal High, i.e., while the first input terminal 41*a* and second input terminal 41*b* of the comparator circuit 41 are an inverting input terminal and a non-inverting input terminal, respectively.

During the period T1A, the first input voltage Vin1 and the second input voltage Vin2 are at the first reference voltage Vref and the inter-terminal voltage Vc, respectively. In addition, the inter-terminal voltage Vc rises along with time. Accordingly, the inter-terminal voltage Vc rises from the second reference voltage Vref/M to the first reference voltage Vref. In addition, the control signal S1 is kept at the first control signal High.

During the period T1B, the first input voltage Vin1 and the second input voltage Vin2 are at the inter-terminal voltage Vc and the second reference voltage Vref/M, respectively. In addition, the inter-terminal voltage Vc lowers along with time. Accordingly, the inter-terminal voltage Vc lowers from the first reference voltage Vref to the second reference voltage Vref/M. In addition, the control signal S1 is kept at the second control signal Low.

During the period TIC, conversely to the period T1A, the first input voltage Vin1 and the second input voltage Vin2 are at the inter-terminal voltage Vc and the first reference voltage Vref, respectively. In addition, the inter-terminal voltage Vc rises along with time. Accordingly, the inter-terminal voltage Vc rises from the second reference voltage Vref/M to the first reference voltage Vref. In addition, the control signal S1 is kept at the first control signal High.

During the period T1D, conversely to the period T1B, the first input voltage Vin1 and the second input voltage Vin2 are at the second reference voltage Vref/M and the inter-terminal voltage Vc, respectively. In addition, the inter-terminal voltage Vc lowers along with time. Accordingly, the inter-terminal voltage Vc lowers from the first reference voltage Vref to the second reference voltage Vref/M. In addition, the control signal S1 is kept at the second control signal Low.

During the periods T1A and TIC, the non-inverting input terminal and inverting input terminal of the comparator circuit 41 are switched. During the periods T1B and T1D, the non-inverting input terminal and inverting input terminal of the comparator circuit 41 are switched. This can cancel the effect of an input offset resulting from variations in an active element, such as a transistor, provided in the comparator circuit 41.

Time Variations During Second Period T2

Figure 8B:
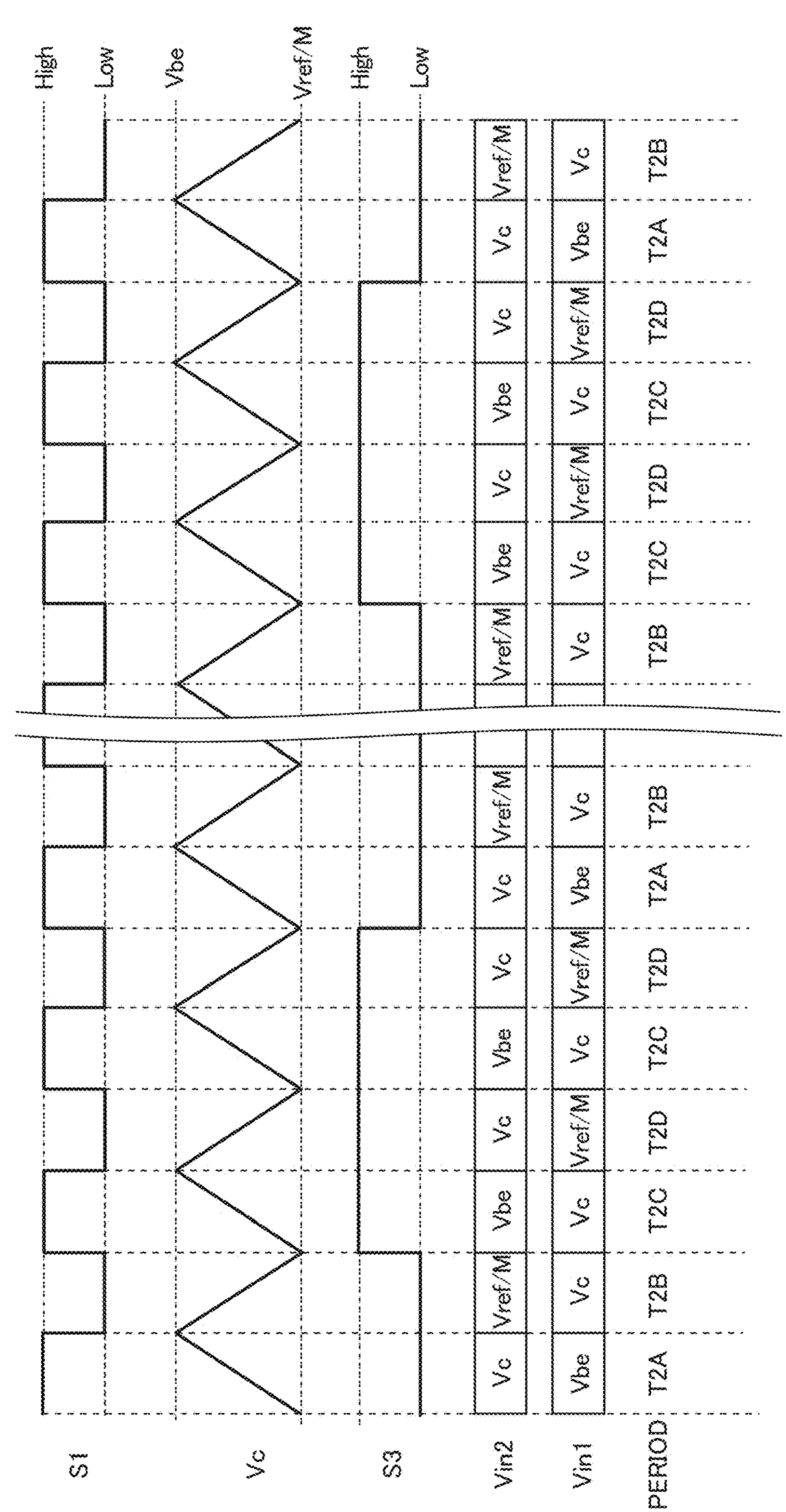
FIG. 8B is a timing chart showing the following time variations during the second period T2: time variations of the first input voltage Vin1 and the second input voltage Vin2, which are input to the comparator provided in the temperature measuring circuit according to the second embodiment; time variations of the inter-terminal voltage Vc, which is generated by the capacitor provided in the temperature measuring circuit; time variations of the control signal S1, which is output by the control circuit provided in the temperature measuring circuit; and time variations of the control signal S3, which is output by the switching control circuit provided in the temperature measuring circuit.

FIG. 8B is a timing chart showing the following time variations during the second period T2: time variations of the first input voltage Vin1 and the second input voltage Vin2, which are input to the comparator provided in the temperature measuring circuit according to the second embodiment; time variations of the inter-terminal voltage Vc, which is generated by the capacitor provided in the temperature measuring circuit; time variations of the control signal S1, which is output by the control circuit provided in the temperature measuring circuit; and time variations of the control signal S3, which is output by the switching control circuit provided in the temperature measuring circuit.

As shown in FIG. 8B, in the temperature measuring circuit 2 in Steps S138 to S153, the periods T2A and T2B come alternately while the control signal S3 during the second period T2 is at the second control signal Low, i.e., while the first input terminal 41*a* and second input terminal 41*b* of the comparator circuit 41 are a non-inverting input terminal and an inverting input terminal, respectively; moreover, the period T2C and T2D come alternately while the control signal S3 during the second period T2 is at the first control signal High, i.e., while the first input terminal 41*a* and second input terminal 41*b* of the comparator circuit 41 are an inverting input terminal and a non-inverting input terminal, respectively.

During the period T2A, the first input voltage Vin1 and the second input voltage Vin2 are at the third reference voltage Vbe and the inter-terminal voltage Vc, respectively. In addition, the inter-terminal voltage Vc rises along with time. Accordingly, the inter-terminal voltage Vc rises from the second reference voltage Vref/M to the third reference voltage Vbe. In addition, the control signal S1 is kept at the first control signal High.

During the period T2B, the first input voltage Vin1 and the second input voltage Vin2 are at the inter-terminal voltage Vc and the second reference voltage Vref/M, respectively. In addition, the inter-terminal voltage Vc lowers along with time. Accordingly, the inter-terminal voltage Vc lowers from the third reference voltage Vbe to the second reference voltage Vref/M. In addition, the control signal S1 is kept at the second control signal Low.

During the period T2C, conversely to the period T2A, the first input voltage Vin1 and the second input voltage Vin2 are at the inter-terminal voltage Vc and the third reference voltage Vbe, respectively. In addition, the inter-terminal voltage Vc rises along with time. Accordingly, the inter-terminal voltage Vc rises from the second reference voltage Vref/M to the third reference voltage Vbe. In addition, the control signal S1 is kept at the first control signal High.

During the period T2D, conversely to the period T2B, the first input voltage Vin1 and the second input voltage Vin2 are at the second reference voltage Vref/M and the inter-terminal voltage Vc, respectively. In addition, the inter-terminal voltage Vc lowers along with time. Accordingly, the inter-terminal voltage Vc lowers from the third reference voltage Vbe to the second reference voltage Vref/M. In addition, the control signal S1 is kept at the second control signal Low.

During the periods T2A and T2C, the non-inverting input terminal and inverting input terminal of the comparator circuit 41 are switched. During the periods T2B and T2D, the non-inverting input terminal and inverting input terminal of the comparator circuit 41 are switched. This can cancel the effect of an input offset resulting from variations in an active element, such as a transistor, provided in the comparator circuit 41.

The present disclosure is not limited to the above-described embodiment. The present disclosure may be replaced with a configuration substantially identical to those described in the above-described embodiment, a configuration that provides the same action and effect as those described in the above-described embodiment, or a configuration that can achieve the same object as those described in the above-described embodiment.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A temperature measuring circuit comprising:

a capacitor configured to generate an inter-terminal voltage corresponding to an amount of stored electric charge;

a first current supply configured to feed a first current;

a second current supply configured to feed a second current;

a first voltage supply configured to generate a first reference voltage;

a second voltage supply configured to generate a second reference voltage;

a third voltage supply configured to generate a third reference voltage corresponding to a temperature;

a comparator circuit configured to output an output voltage indicating levels of two input voltages that are received;

a first switch circuit configured to, upon receiving a first control signal, charge the capacitor through the first current and set the two input voltages at a selected reference voltage and the inter-terminal voltage, and upon receiving a second control signal, discharge the capacitor through the second current and set the two input voltages at the second reference voltage and the inter-terminal voltage;

a second switch circuit configured to switch between a first connection state in which the selected reference voltage is set at the first reference voltage, and a second connection state in which the selected reference voltage is set at the third reference voltage;

a control circuit configured to, during a first period, set a control signal at the second control signal in response to the output voltage indicating that the inter-terminal voltage is higher than the first reference voltage while the control signal is set at the first control signal and the second switch circuit is in the first connection state, and set the control signal at the first control signal and bring the second switch circuit into the first connection state in response to the output voltage indicating that the inter-terminal voltage is lower than the second reference voltage while the control signal is set at the second control signal, and during a second period, set the control signal at the second control signal in response to the output voltage indicating that the inter-terminal voltage is higher than the third reference voltage while the control signal is set at the first control signal and the second switch circuit is in the second connection state, and set the control signal at the first control signal and bring the second switch circuit into the second connection state in response to the output voltage indicating that the inter-terminal voltage is lower than the second reference voltage while the control signal is set at the second control signal;

a counter circuit configured to count a first frequency of the control signal during the first period, and a second frequency of the control signal during the second period; and a temperature obtaining unit configured to obtain the temperature based on the first and second frequencies.

2. The temperature measuring circuit according to claim 1, wherein the first and second reference voltages are stable with respect to the temperature.

3. The temperature measuring circuit according to claim 1, wherein the second reference voltage is 1/M times of the first reference voltage, where M is a positive value greater than 1.

4. The temperature measuring circuit according to claim 1, wherein the third voltage supply includes a bipolar transistor having a base, a collector, and an emitter, and the third reference voltage is generated between the base and the emitter.

5. The temperature measuring circuit according to claim 1, wherein the temperature obtaining unit determines the third reference voltage from the first and second reference voltages and the first and second frequencies in accordance with following Mathematical Expression (1), and obtains the temperature from a temperature property of the third reference voltage:

[Mathematical Expression 1]

$$Vbe = \frac{F1}{F2} \times \left(Vref - \frac{Vref}{M}\right) + \frac{Vref}{M}, \quad (1)$$

where Vref denotes the first reference voltage, where Vref/M denotes the second reference voltage, where F1 denotes the first frequency, where F2 denotes the second frequency, and where Vbe denotes the third reference voltage.

6. The temperature measuring circuit according to claim 1 comprising a switching control circuit configured to divide the control signal and output the control signal that has been divided.

7. The temperature measuring circuit according to claim 6, wherein the comparator circuit includes a first input terminal to which one of the two input voltages is input, a second input terminal to which another of the two input voltages is input, and a switching circuit configured to, while the control signal that has been divided is the first control signal, set the output voltage at a first output voltage in response to the one higher than the another, and set the output voltage at a second output voltage in response to the one lower than the another, and while the control signal that has been divided is the second control signal, set the output voltage at the second output voltage in response to the one higher than the another, and set the output voltage at the first output voltage in response to the one lower than the another.

8. The temperature measuring circuit according to claim 1, wherein the two input voltages are a first input voltage and a second input voltage, the comparator circuit sets the output voltage at a first output voltage in response to the first input voltage higher than the second input voltage, and sets the output voltage at the second output voltage in response to the first input voltage lower than the second input voltage, setting the selected reference voltage and the inter-terminal voltage at the two input voltages is equivalent to setting the selected reference voltage and the inter-terminal voltage at the first input voltage and the second input voltage, respectively, setting the second reference voltage and the inter-terminal voltage at the two input voltages is equivalent to setting the second reference voltage and the inter-terminal voltage at the second input voltage and the first input voltage, respectively, the output voltage indicating that the inter-terminal voltage is higher than the first reference voltage is equivalent to a change of the output voltage from the first reference voltage to the second output voltage, the output voltage indicating that the inter-terminal voltage is lower than the second reference voltage is equivalent to a change of the output voltage from the first output voltage to the second output voltage, and the output voltage indicating that the inter-terminal voltage is higher than the third reference voltage is equivalent to a change of the output voltage from the first output voltage to the second output voltage.

* * * * *